(12) United States Patent
Anderson et al.

(10) Patent No.: US 7,224,029 B2
(45) Date of Patent: May 29, 2007

(54) METHOD AND STRUCTURE TO CREATE MULTIPLE DEVICE WIDTHS IN FINFET TECHNOLOGY IN BOTH BULK AND SOI

(75) Inventors: Brent A. Anderson, Jericho, VT (US); Edward J. Nowak, Essex Junction, VT (US); Jed H. Rankin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 10/707,964

(22) Filed: Jan. 28, 2004

(65) Prior Publication Data

US 2005/0161739 A1    Jul. 28, 2005

(51) Int. Cl.
*H01L 21/36* (2006.01)
*H01L 27/01* (2006.01)

(52) U.S. Cl. .............. 257/347; 257/350; 257/351; 257/369; 257/344; 257/296

(58) Field of Classification Search ............. 257/200, 257/201, 202, 207, 205, 349, 350, 351, 374, 257/208, 369, 370, 371, 376
See application file for complete search history.

(56) References Cited

U.S. PATENT DOCUMENTS

| | | | |
|---|---|---|---|
| 5,739,057 A | 4/1998 | Tiwari et al. | |
| 6,342,410 B1 | 1/2002 | Yu | |
| 6,432,829 B2 | 8/2002 | Muller | |
| 6,475,890 B1 | 11/2002 | Yu | |
| 6,492,212 B1 | 12/2002 | Ieong et al. | |
| 6,525,403 B2 | 2/2003 | Inaba et al. | |
| 6,562,665 B1 | 5/2003 | Yu | |
| 6,756,643 B1 * | 6/2004 | Achuthan et al. | 257/365 |
| 6,787,406 B1 * | 9/2004 | Hill et al. | 438/164 |
| 2003/0042531 A1 | 3/2003 | Lee et al. | |
| 2003/0102518 A1 | 6/2003 | Fried et al. | |
| 2003/0113970 A1 | 6/2003 | Fried et al. | |
| 2003/0193058 A1 * | 10/2003 | Fried et al. | 257/200 |

* cited by examiner

*Primary Examiner*—Evan Pert
*Assistant Examiner*—Fazli Erdem
(74) *Attorney, Agent, or Firm*—Gibb I.P. Law Firm, LLC; William D. Sabo, Esq.

(57) ABSTRACT

Disclosed is a structure and method for producing a fin-type field effect transistor (FinFET) that has a buried oxide layer over a substrate, at least one first fin structure and at least one second fin structure positioned on the buried oxide layer. First spacers are adjacent the first fin structure and second spacers are adjacent the second fin structure. The first spacers cover a larger portion of the first fin structure when compared to the portion of the second fin structure covered by the second spacers. Those fins that have larger spacers will receive a smaller area of semiconductor doping and those fins that have smaller spacers will receive a larger area of semiconductor doping. Therefore, there is a difference in doping between the first fins and the second fins that is caused by the differently sized spacers. The difference in doping between the first fins and the second fins changes an effective width of the second fins when compared to the first fins.

11 Claims, 15 Drawing Sheets

METHOD AND STRUCTURE TO CREATE MULTIPLE DEVICE WIDTHS IN FINFET TECHNOLOGY IN BOTH BULK AND SOI

BACKGROUND OF INVENTION

1. Field of the Invention

The present invention generally relates to fin-type field effect transistor (FinFET) structure and more particularly to an improved structure that includes differently sized spacers adjacent the fins which operate to change the effective width of the fins.

2. Description of the Related Art

As the end of linear scaling of planar complementary metal oxide semiconductors (CMOS) approaches, alternative device structures are being evaluated. One of the primary candidates is FinFET technology, where a thin fin, or pillar of silicon is created using sub-lithographic techniques, thereby allowing placement of the gate on sides of the Fin, which in the on state, fully depletes the silicon in the fin, making it a high performance device. U.S. Pat. No. 6,413,802 to Hu et al. (hereinafter "Hu"), which is incorporated herein by reference, discloses one example of a FinFET structure.

Conventional CMOS designers have the flexibility of using any (as limited by the design grid increments) width device, as well as gate lengths for a variety of performance and power characteristics. With FinFET technology, current integration techniques only allow for variation of the gate length but not the width (the width of a FinFET is determined by the height of the fin). This limitation in the device design creates difficulty for both porting existing designs into FinFET technology, as well as designing the plethora of circuits that designers have in their toolkit.

The current industry solution to circumvent this limitation has been to use multiple parallel fins controlled by the same gate. This quantizes the effective width of the device far more than the prior grid limitations. In addition, many designs incorporate slightly larger than minimum devices to get similar characteristics to the high performance device, without quite as much power consumption, or susceptibility to the effects of across chip line variation (ACLV). The quantization of 1 fin, 2 fins, 3 fins, etc., makes designing a slightly larger than minimum feature impossible. Additionally, for bulk FIN integration schemes, the methods for isolating the fins electrically from the substrate are relatively difficult or expensive, and provide no means for creating multiple device widths.

SUMMARY OF INVENTION

The present invention involves putting a spacer on the lower portion of some FinFETs (using a blocking mask to remove/reduce unwanted spacers), and by using several potential doping schemes, making the area protected behind the spacer electrically inactive. When a gate is subsequently patterned on top of the fin with spacers, a different width device is created than a fin without spacers. There is no limitation as to how many different height spacers could be placed on the wafer simultaneously, however there is an optimal number for balancing the design flexibility with the manufacturing costs.

Thus, the invention first provides a method of making a fin-type field effect transistor (FinFET) structure that begins with forming a buried oxide layer on a substrate (or simply starting with a silicon substrate). Next, the invention forms fins and insulating spacers adjacent the fins. The fin structures all have the same height. For fins, the electrical width is a measure of distance in a direction perpendicular to the surface of the substrate or buried oxide layer. The invention removes at least a portion of some of the insulating spacers, such that first insulating spacers cover a larger portion of first fin structures when compared to the portion of second fin structures covered by second insulating spacers.

After removing the portions of the insulating spacers, the invention dopes the fin structures to make them active semiconductors. The spacers can contain doping impurities that diffuse into the adjacent portions of the fins. These doping impurities have the effect to isolate this region electrically from the remainder of the fin, and maintain the portion of the fin (the lower portion) that is protected by the spacer as an insulator. In this process, those fins that have larger spacers will have less area exposed to become active devices; fins that have smaller spacers have more exposed fin that will become active devices. Therefore, there is a difference in doping between the first fins and the second fins that is caused by the differently sized spacers. The difference in doping between the first fins and the second fins changes an effective width of the second fins when compared to the first fins.

Before forming a gate conductor, the invention forms a gate insulator on the fin structures and the insulating spacers. Then, the invention forms at least one gate conductor over the gate oxide.

This process produces a fin-type field effect transistor (FinFET) that has a buried oxide layer over a substrate, at least one first fin structure and at least one second fin structure positioned on the buried oxide layer. First insulating spacers are adjacent the first fin structures and second insulating spacers are adjacent the second fin structures. The first insulating spacers cover a larger portion of the first fin structure when compared to the portion of the second fin structure covered by the second insulating spacers.

Those fins that have larger spacers will receive a smaller area of active doping and those fins that have smaller spacers will receive a larger area of active doping. Therefore, there is a difference in doping between the first fins and the second fins that is caused by the differently sized spacers. The difference in doping between the first fins and the second fins changes an effective width of the second fins when compared to the first fins without having to use the fins of different physical widths or use multiple fins within each transistor, as is required conventionally.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1A:
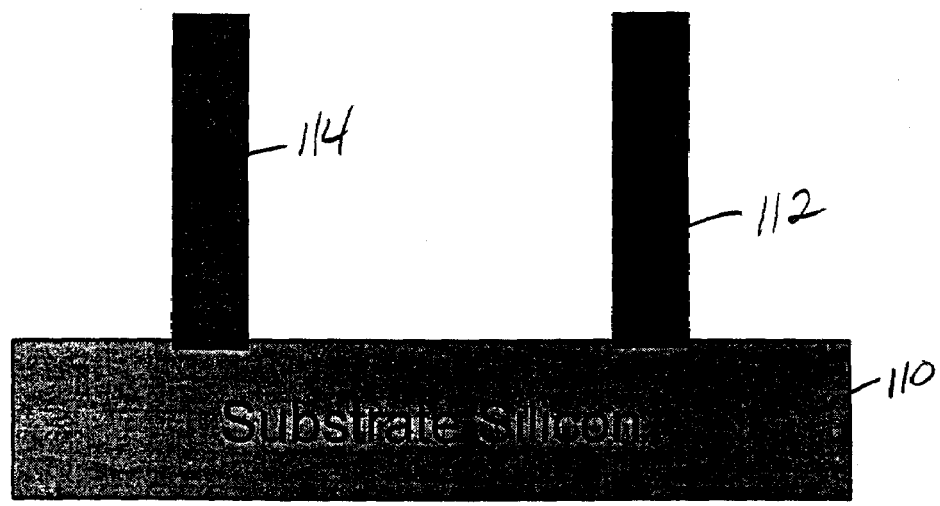
FIGS. 1A and 1B are schematic side view and top view diagrams of a partially completed FinFET structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

FIGS. 1A–7B illustrate a bulk silicon substrate embodiment of the invention and FIGS. 8A–14B illustrate a second silicon-on-insulator (SOI) structure. In all the drawings, the "A" Figures represent a cross-sectional view and the "B" Figures represent a top view showing the line X–X' through which the cross-sectional view is drawn. There are numerous processes that could be used to form the structures discussed below and such processes are well-known to those ordinarily skilled in the art. In order to avoid obscuring the salient features of the invention in unnecessary detail, the discussion of these well-known manufacturing processes have been omitted from the following discussion.

Figure 1B:
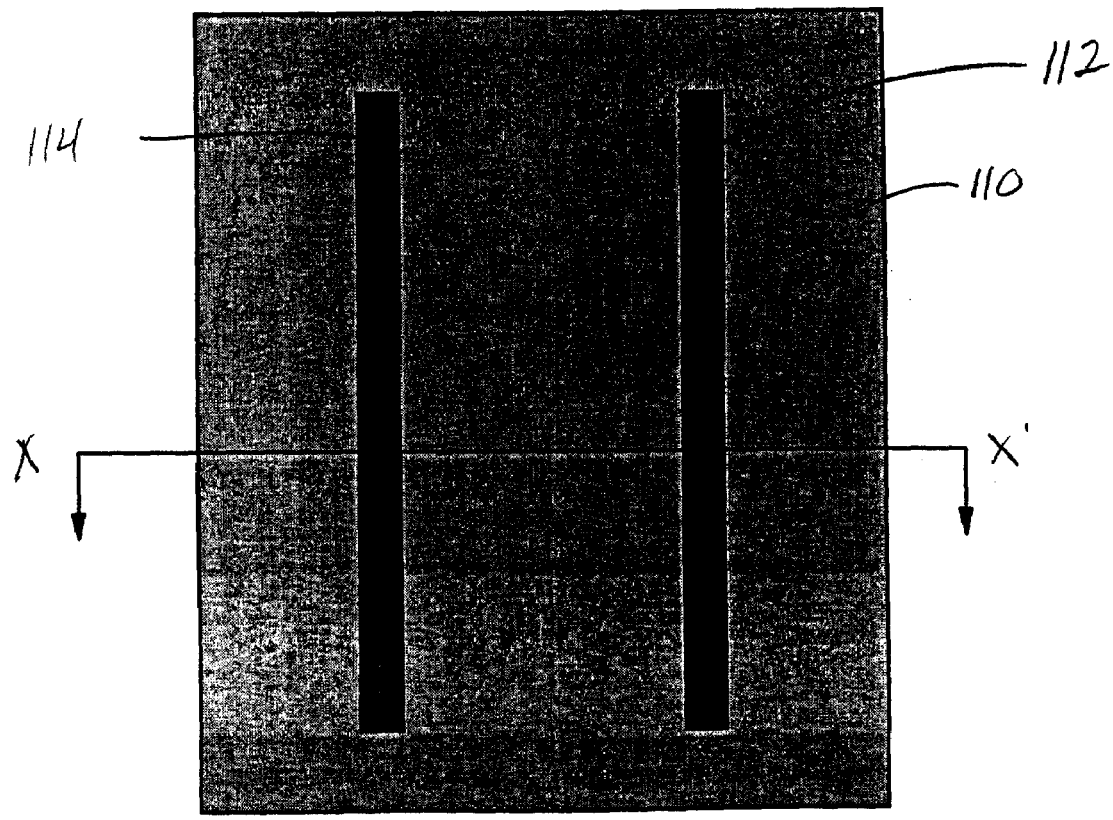
Figure 2A:
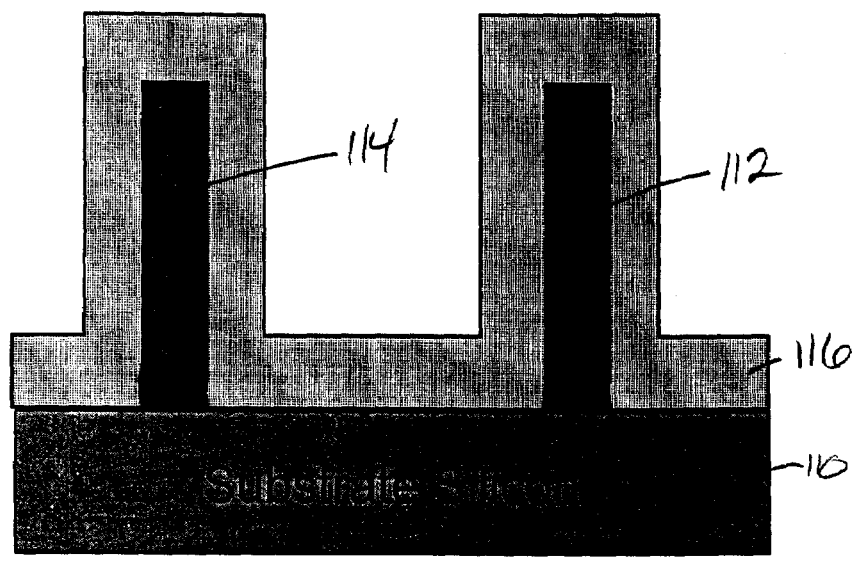
FIGS. 2A and 2B are schematic side view and top view diagrams of a partially completed FinFET structure.
Figure 2B:
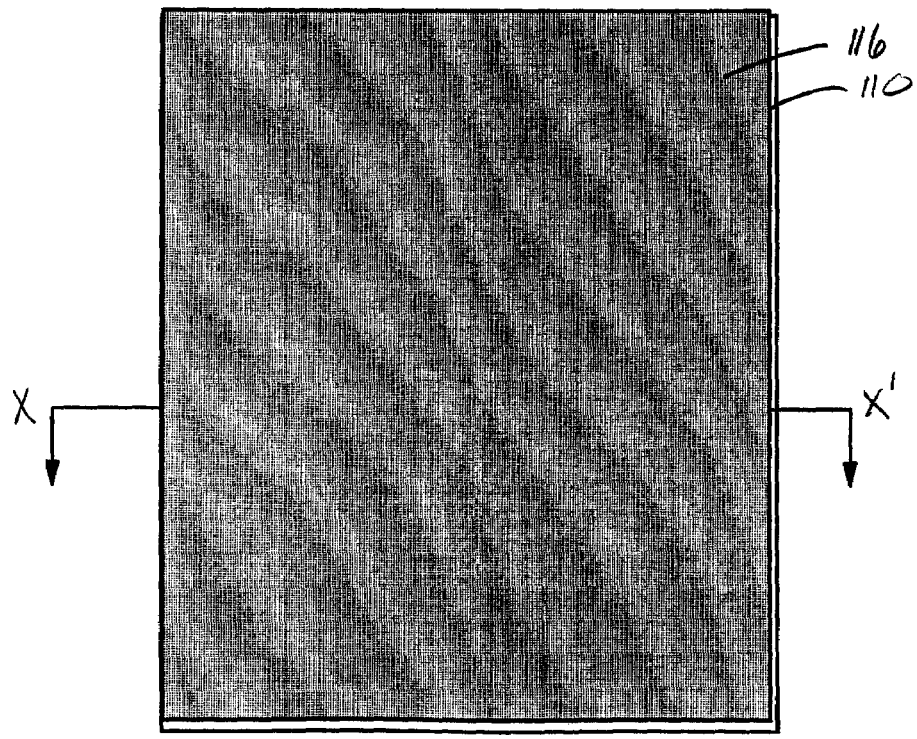
Figure 3A:
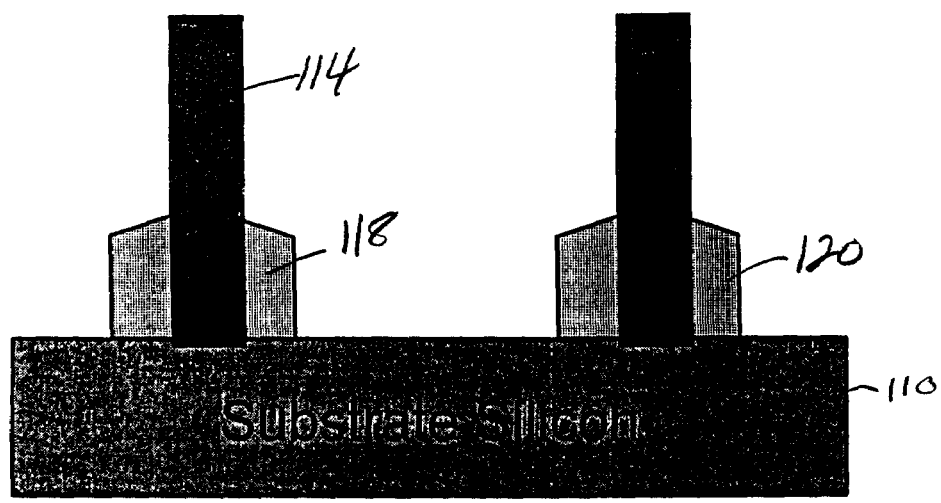
FIGS. 3A and 3B are schematic side view and top view diagrams of a partially completed FinFET structure.
Figure 3B:
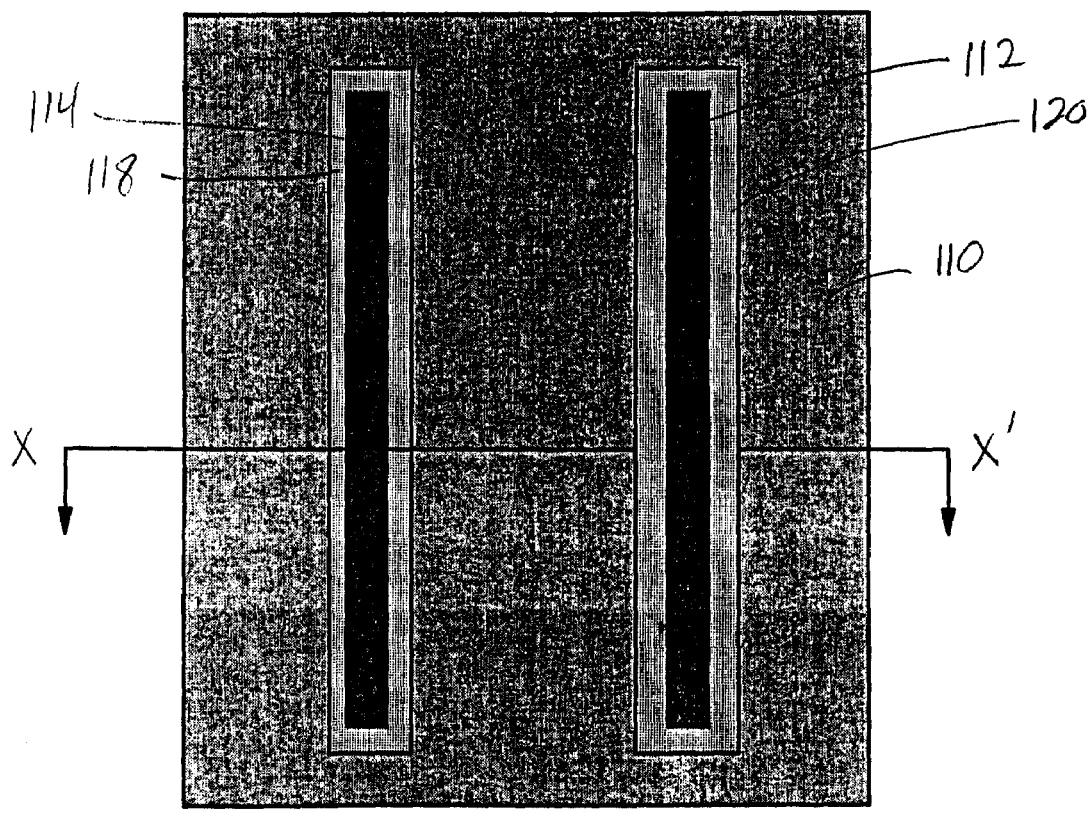

More specifically, FIGS. 1A–1B illustrate two fins 112, 114 formed above a silicon substrate 110 using well-known techniques. In FIGS. 2A–2B, an insulator 116 (which will eventually become the spacers) is deposited over the structure using well-known techniques. The insulator 116 could contain a doping impurity designed to diffuse from the insulator 116 into the fins 112, 114 (upon, for example, heating) to electrically isolate this part of the fin from the active portion later. The doping impurity that is selected depends upon the type of semiconductor impurity that will be used, and such chemistries are well-known to those ordinarily skilled in the art. For example, if complementary (e.g., NFET, PFET) are being manufactured simultaneously one type of impurity (with an opposing impurity doping spacer) would be used for a first type of transistor, and a different type of impurity (also with a relatively opposing impurity doping spacer) would be used for the other type(s) of transistors. In FIGS. 3A–3C, the insulator material 116 is etched in a selective anisotropic etching process to leave the insulator material 116 only on the lower sidewalls of the fins 112, 114 using well-known techniques. The spacers are identified as numbers 118 and 120 in the drawings.

Figure 4A:
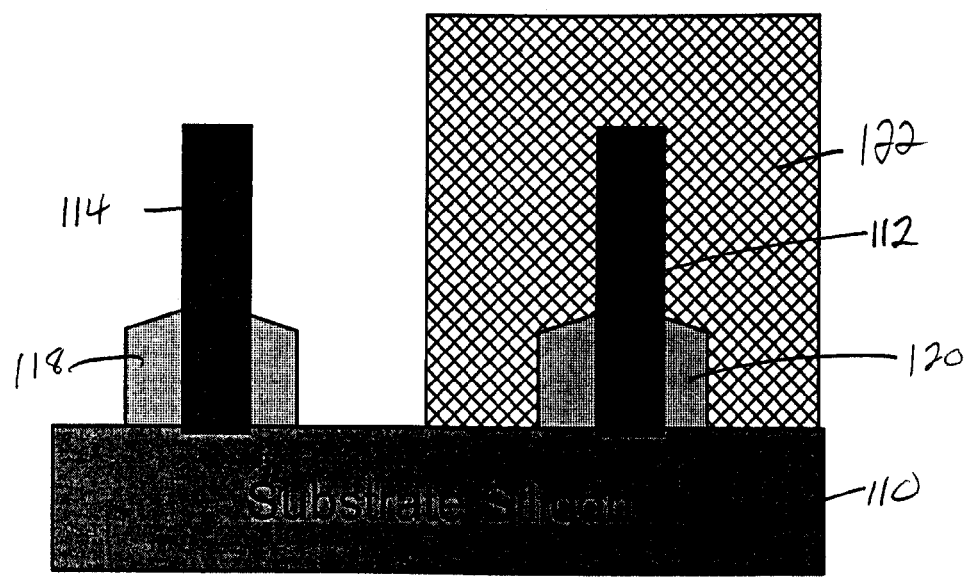
FIGS. 4A and 4B are schematic side view and top view diagrams of a partially completed FinFET structure.
Figure 4B:
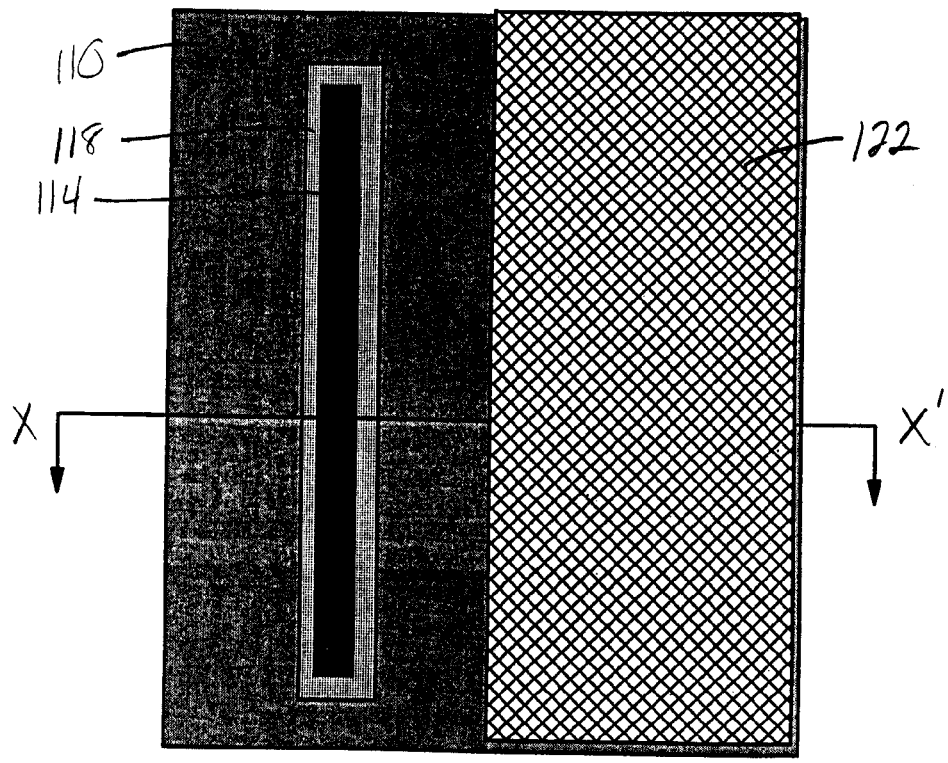
Figure 5A:
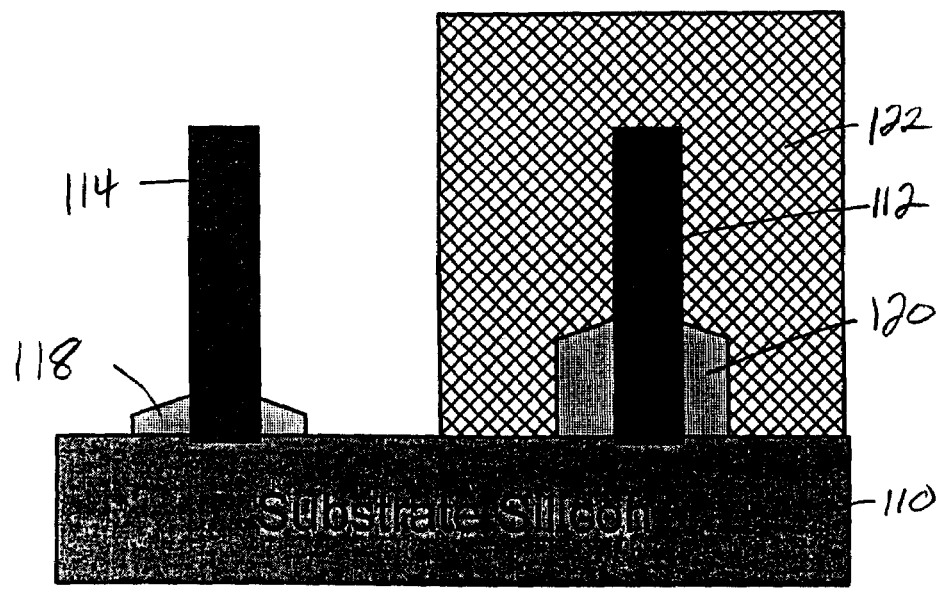
FIGS. 5A and 5B are schematic side view and top view diagrams of a partially completed FinFET structure.
Figure 5B:
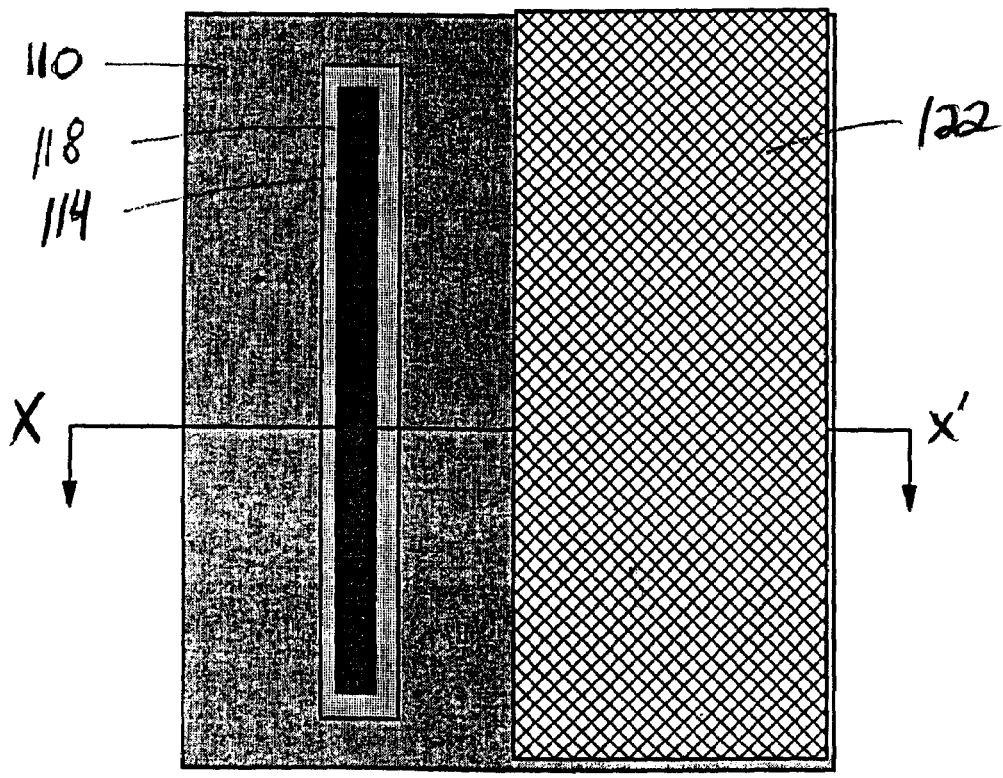
Figure 6A:
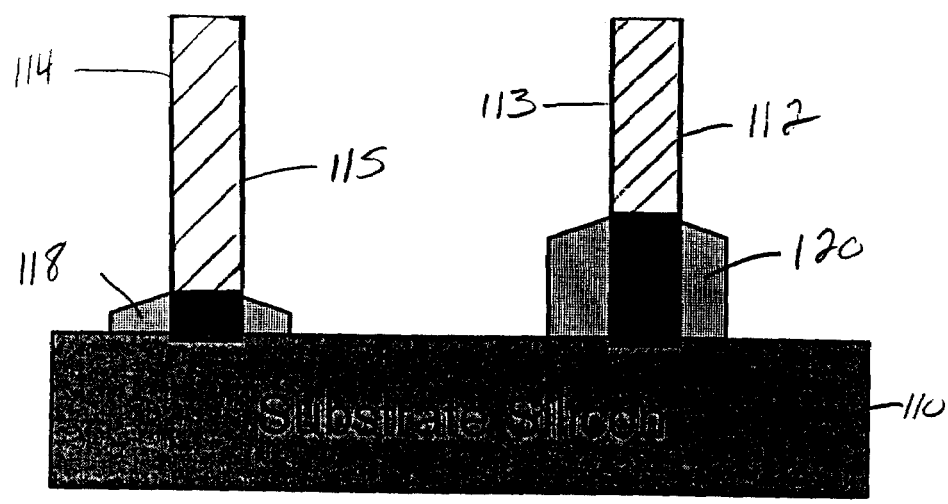
FIGS. 6A and 6B are schematic side view and top view diagrams of a partially completed FinFET structure.
Figure 6B:
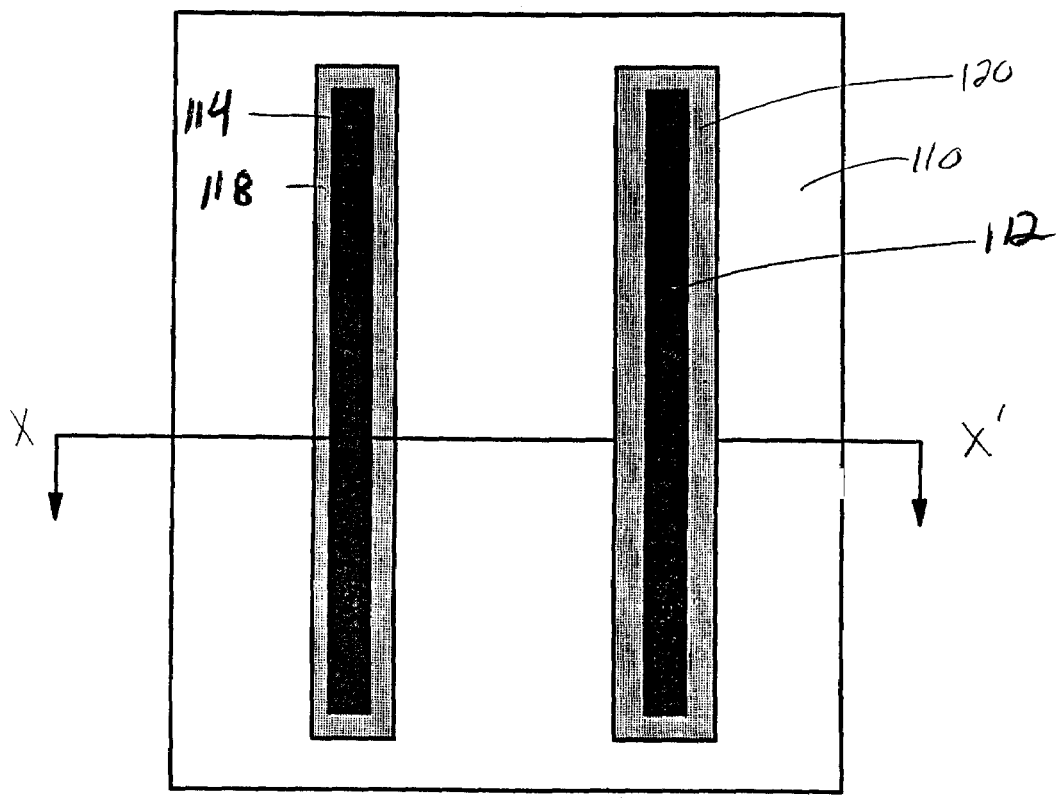

In FIGS. 4A–4B, a protective mask 122 is formed over one of the fins 112 and its associated set of spacers 120 using well-known techniques. This leaves fin 114 and spacers 118 exposed. Next, in FIGS. 5A–5B, an etching (or other similar) process is used to reduce the height of the spacers 118 using well-known techniques. Note that because of the protective mask 122, the height of the spacer 120 is not affected by this etching process. In FIGS. 6A–6B, the protective mask 122 is removed and a semiconductor active area impurity is implanted into the exposed portions 113, 115 of fins 112, 114 using well-known techniques. The spacers 118, 120 can have material compositions and size characteristics sufficient to prevent transmission of the impurity through the spacers. Also, the spacers 118, 120 can also contain doping impurities that diffuse into the adjacent portions of the fins 112, 114. These doping impurities increase the threshold of this portion of the fin device, and maintain the portion of the fin (the lower portion) that is protected by the spacers 118, 120 as an insulator. In this process, those fins that have taller spacers will receive a relatively smaller area of semiconductor doping 113 and those fins that have shorter spacers will receive a relatively larger area of semiconductor doping 115.

Therefore, the portions of the fins 112, 114 that are protected by the spacers 118, 120 will not be electrically active. As is understood by those ordinarily skilled in the art, the impurity changes the material of the fins 112, 114 from poor conductor into a semiconductor 113, 115. Thus, the size of the spacers 118, 120 controls how much (length, area) of the fins 112, 114 will become semiconductors 113, 115. The remainder of the fin (the portion protected by the spacers 118, 120) will remain as an intrinsic silicon, while the exposed portion 113, 115 of each fin 112, 114 will become doped to function as an active semiconductor. In this way, the size of the spacers 118, 120 controls the effective semiconductor width of the fin.

Figure 7A:
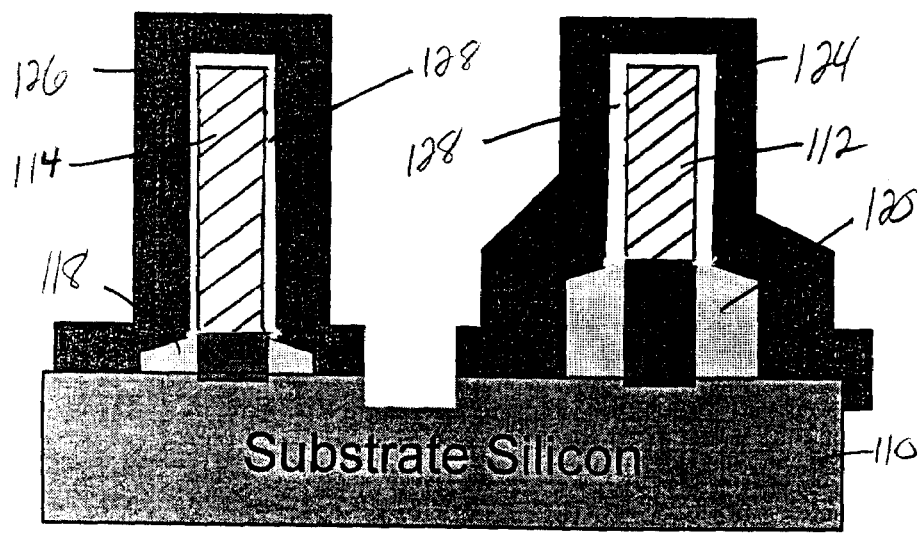
FIGS. 7A and 7B are schematic side view and top view diagrams of a partially completed FinFET structure.
Figure 7B:
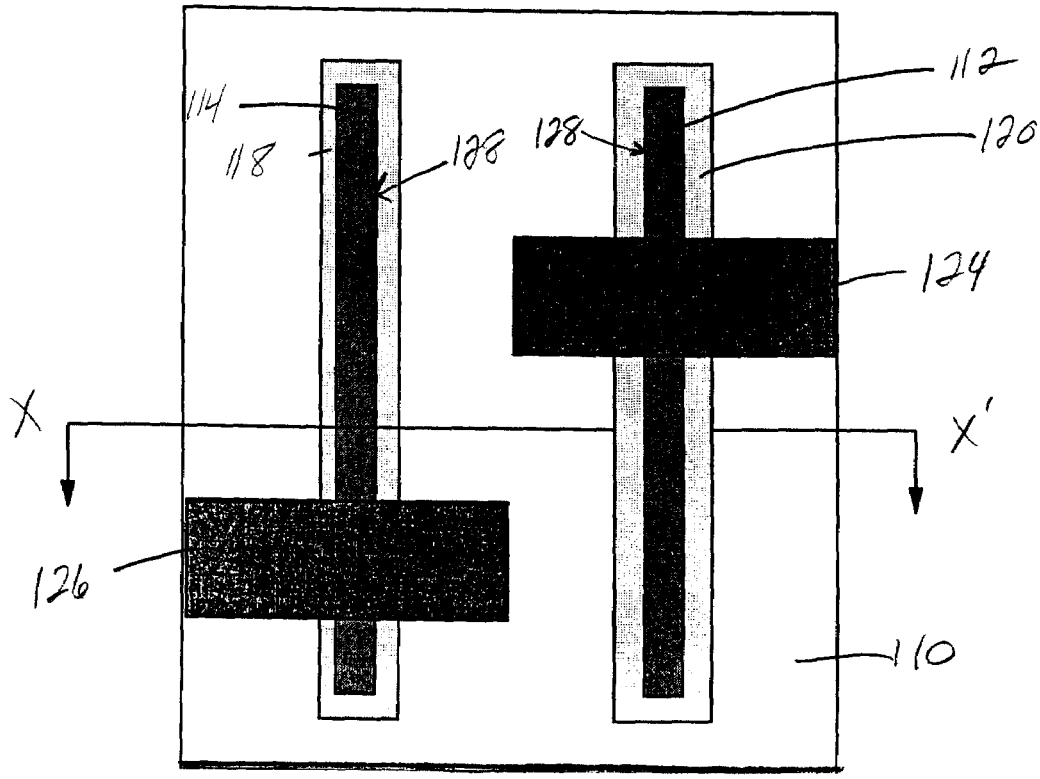

Next, as shown in FIGS. 7A and 7B, gate conductors and gate oxide 124, 126 are formed over the fins using well-known techniques. In this example, the gate conductors 124, 126 are separate and therefore the fins 112, 114 form individual transistors. However, one ordinarily skilled in the art would understand that the invention is equally applicable to transistors that utilize multiple fins per transistor where a common gate conductor covers a number of fins. Additional structures that would be formed using well-known techniques include additional sidewall insulators, source/drain regions, contacts, etc.

FIGS. 8A–14B illustrate a second embodiment of the invention that utilizes an SOI structure. In this embodiment, one set of spacers is completely removed from the structure. For consistency, the same numbering scheme is used in the second embodiment for the same materials and structures discussed above in the first embodiment.

Figure 8A:
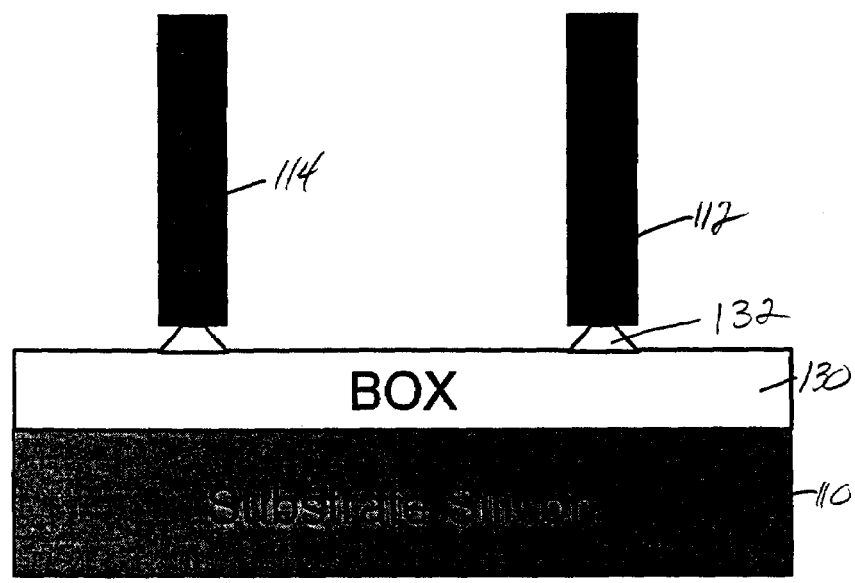
FIGS. 8A and 8B are schematic side view and top view diagrams of a partially completed FinFET structure.
Figure 8B:
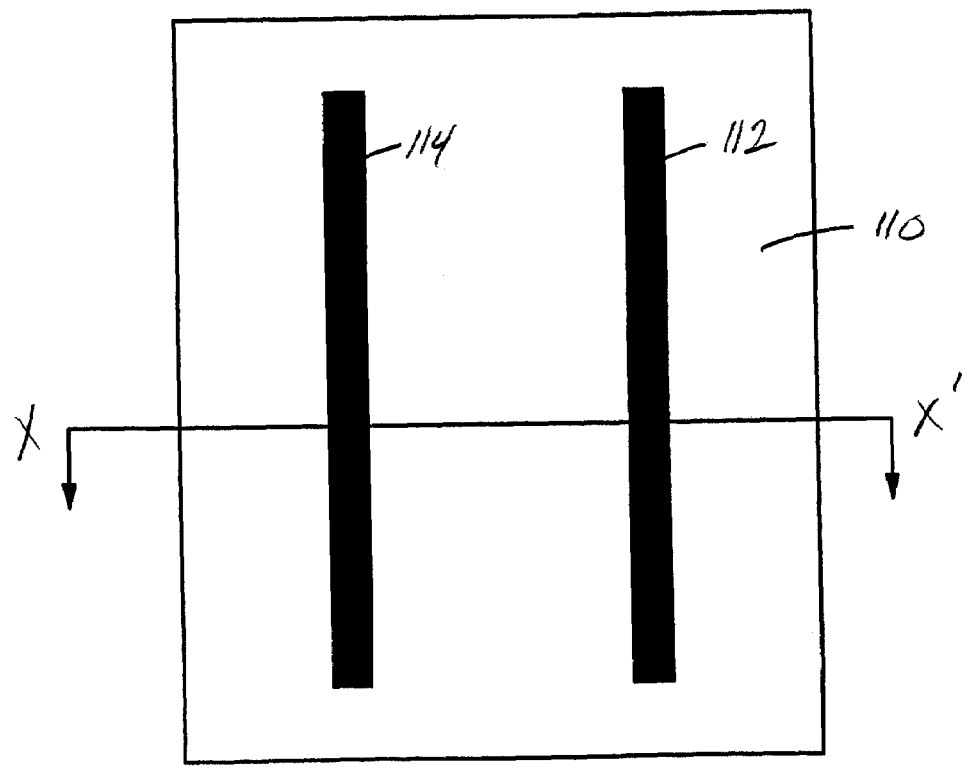
Figure 9A:
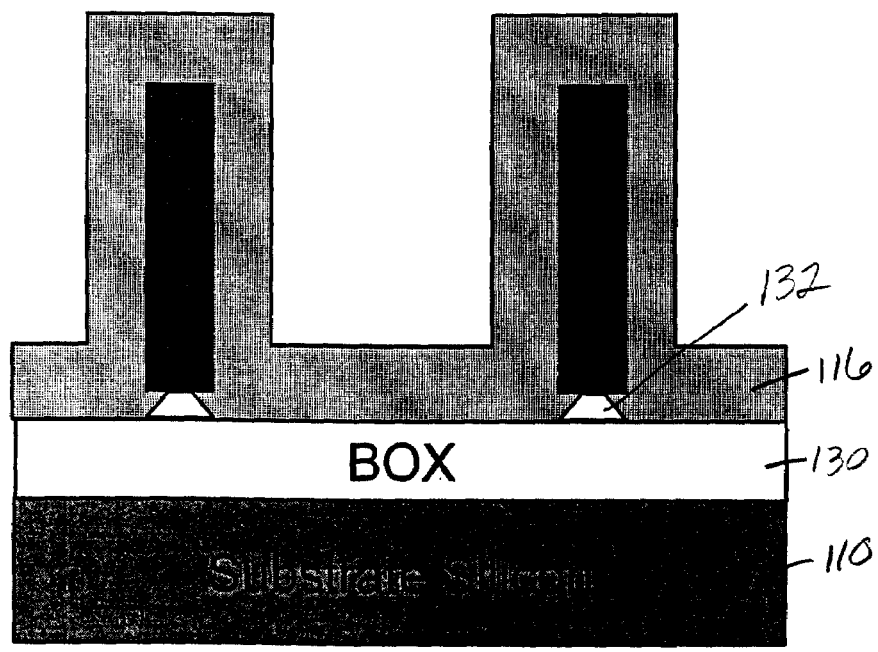
FIGS. 9A and 9B are schematic side view and top view diagrams of a partially completed FinFET structure.
Figure 9B:
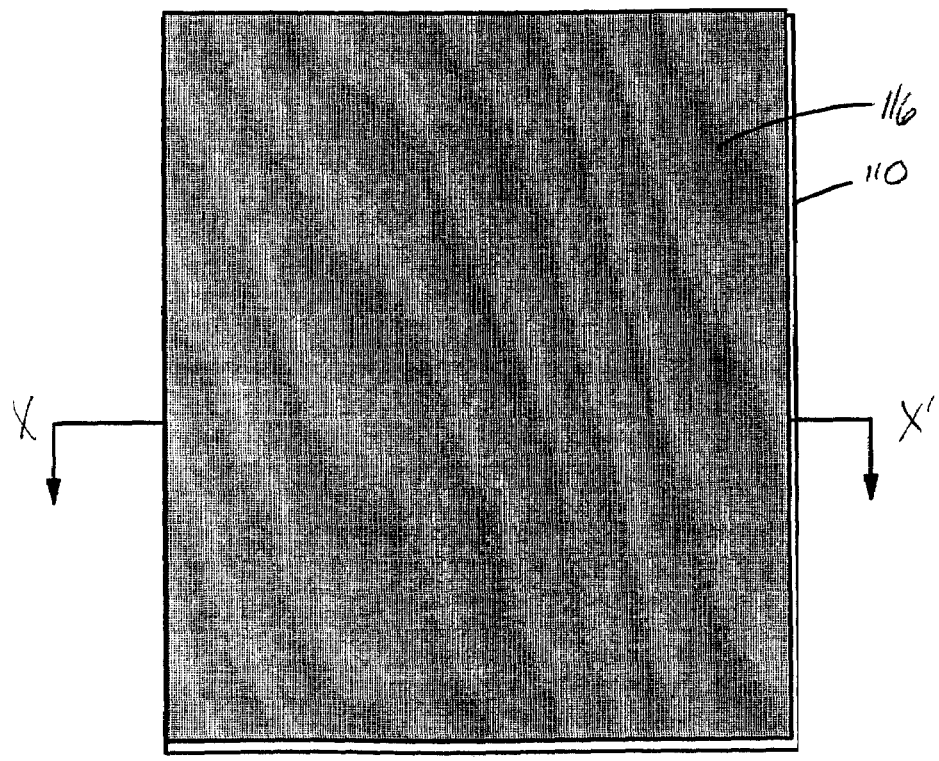
Figure 10A:
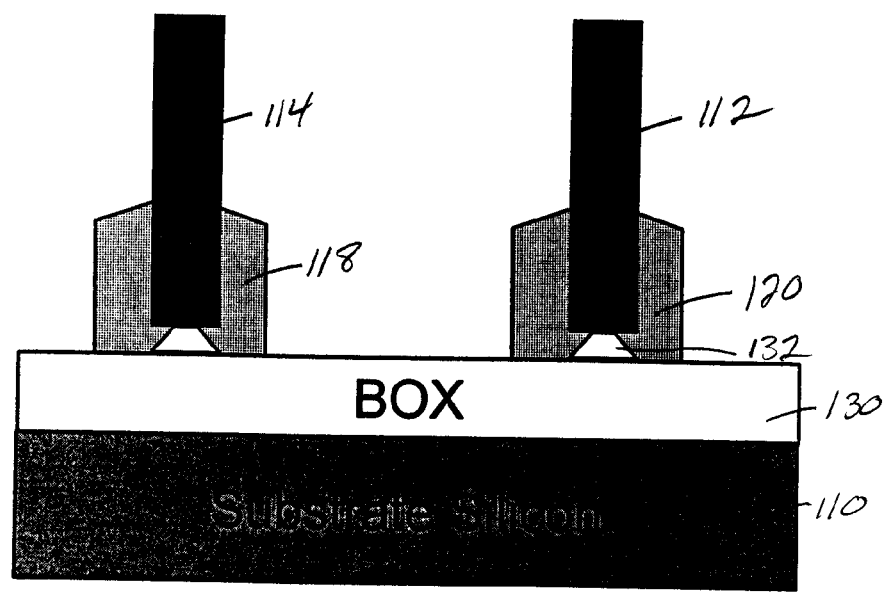
FIGS. 10A and 10B are schematic side view and top view diagrams of a partially completed FinFET structure.
Figure 10B:
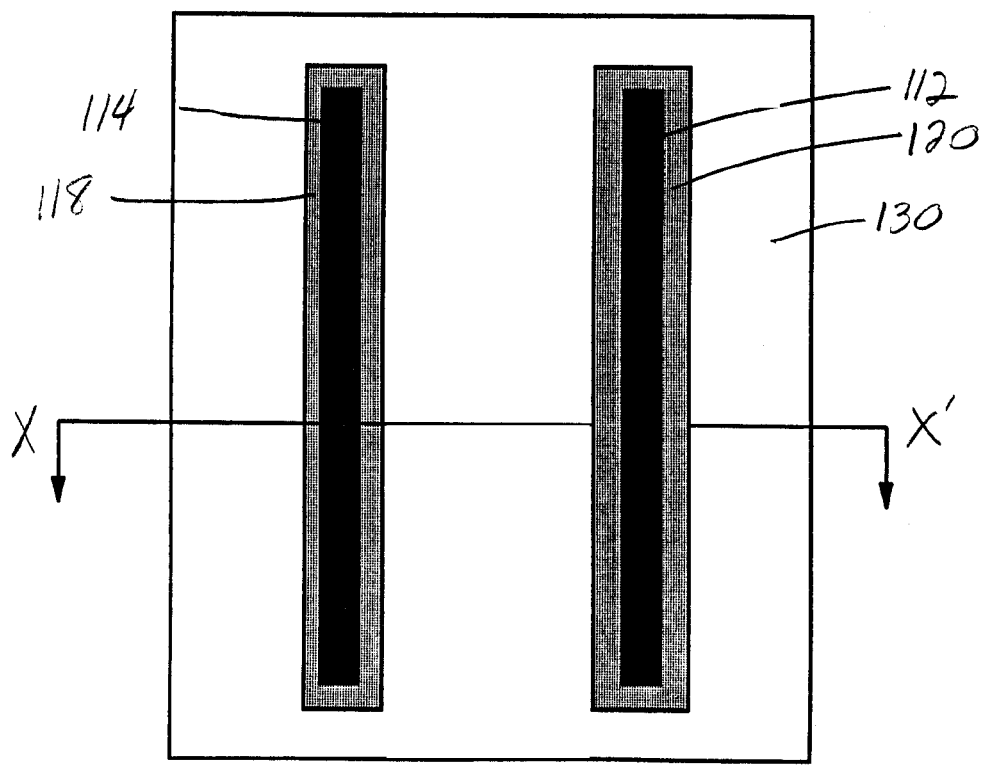

More specifically, FIGS. 8A–8B illustrate two fins 112, 114 formed above a buried oxide layer 130 on silicon substrate 110 using well-known techniques. In FIGS. 9A–9B, an insulator 116 (which will eventually become the spacers) is deposited over the structure using well-known techniques. In FIGS. 10A–10C, the insulator material 116 is etched in a selective anisotropic etching process to leave the insulator material 116 only on the lower side walls of the fins 112, 114 using well-known techniques. The spacers are again identified as numbers 118 and 120 in the drawings.

Figure 11A:
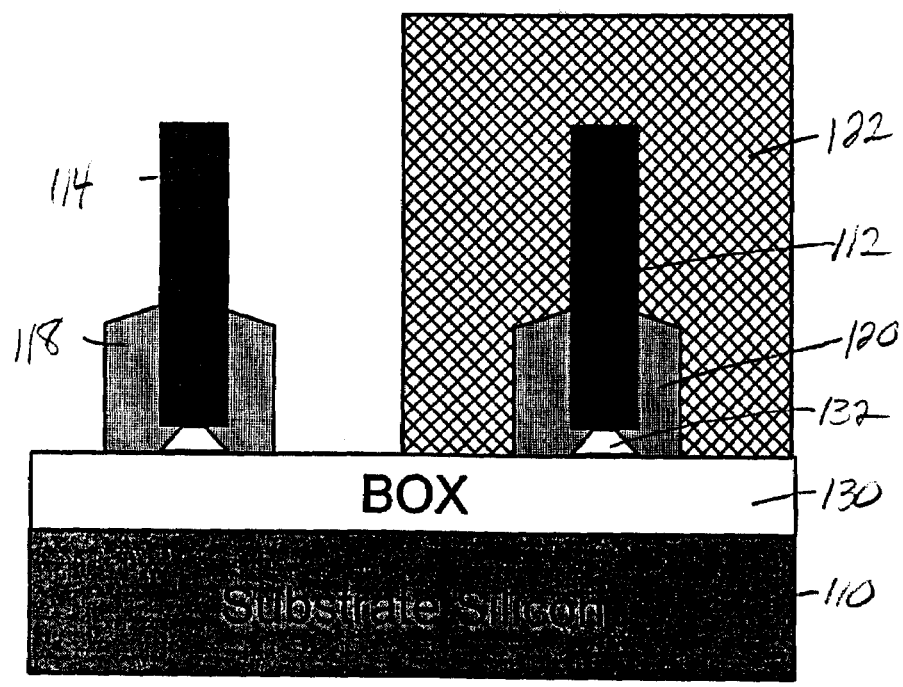
FIGS. 11A and 11B are schematic side view and top view diagrams of a partially completed FinFET structure.
Figure 11B:
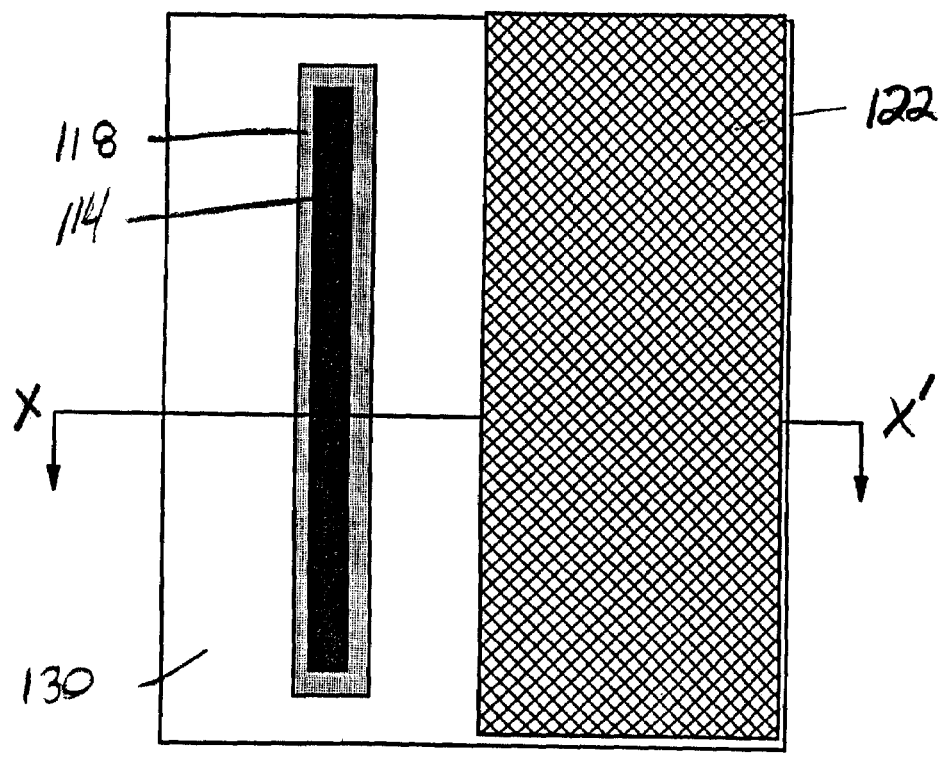
Figure 12A:
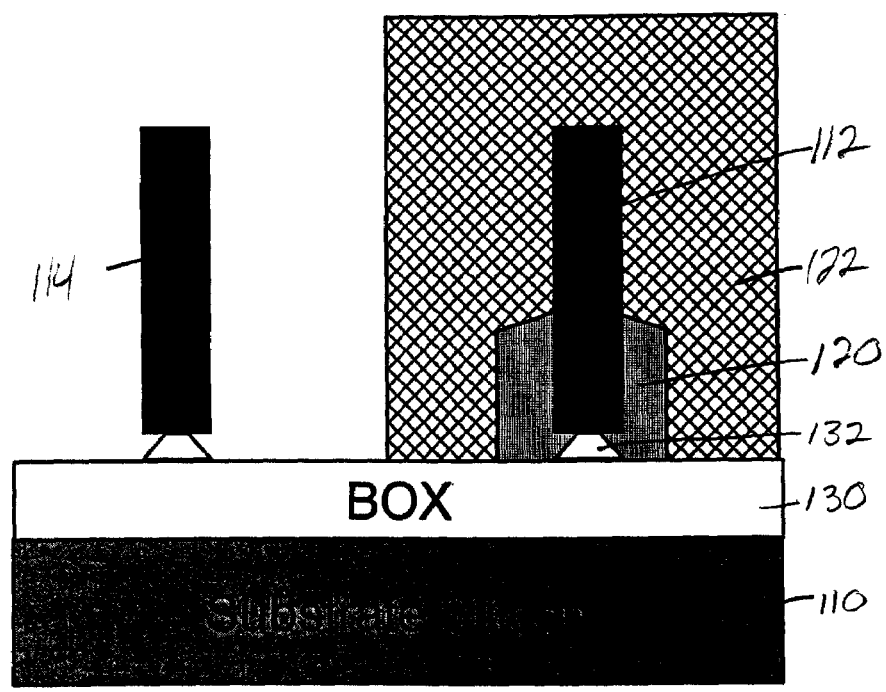
FIGS. 12A and 12B are schematic side view and top view diagrams of a partially completed FinFET structure.
Figure 12B:
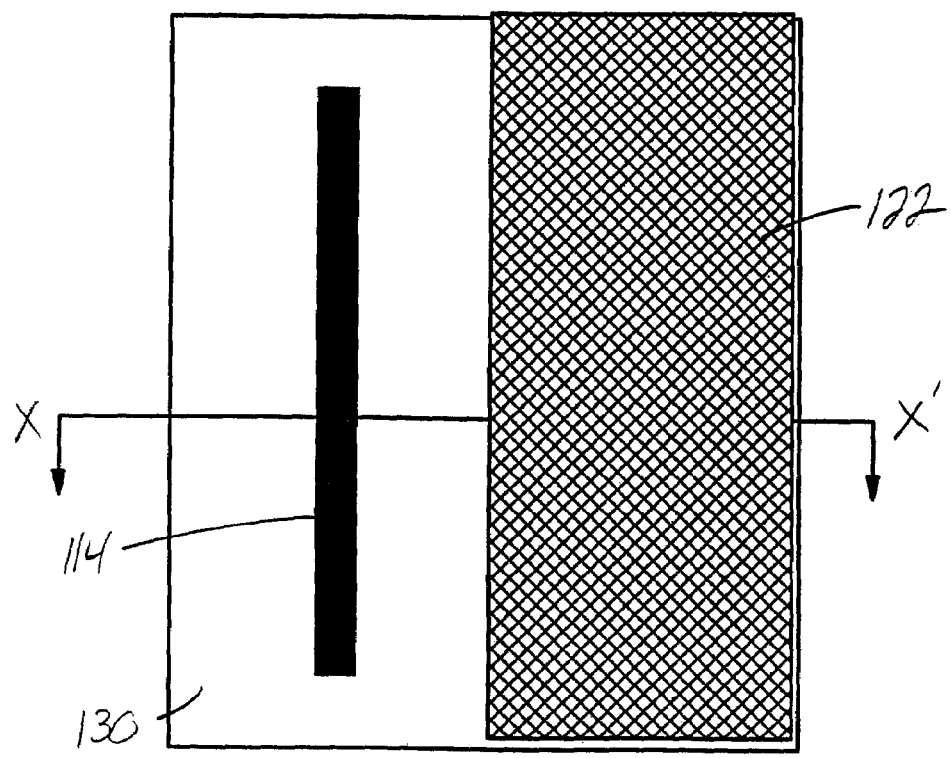
Figure 13A:
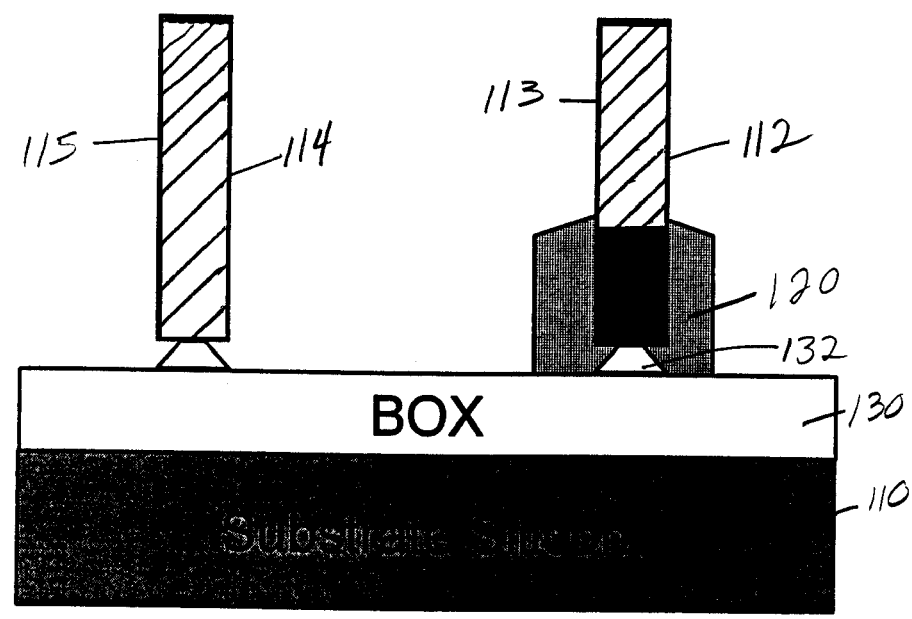
FIGS. 13A and 13B are schematic side view and top view diagrams of a partially completed FinFET structure.
Figure 13B:
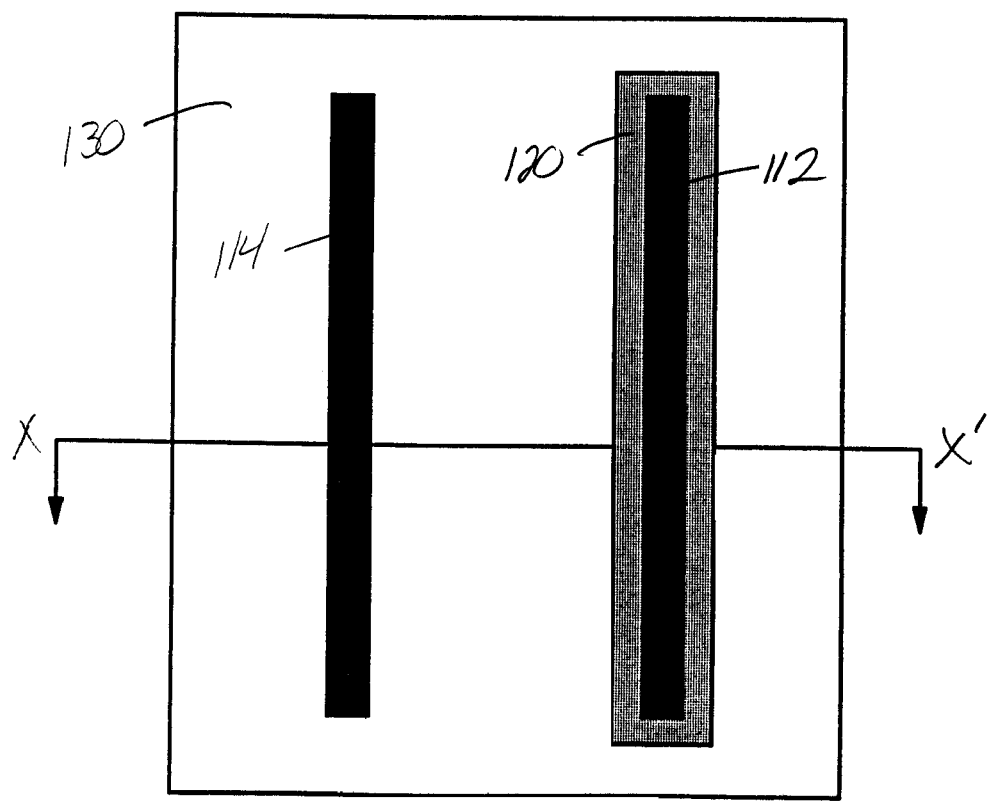

In FIGS. 11A–11B, a protective mask 122 is formed over one of the fins 112 and its associated set of spacers 120 using well-known techniques. This leaves fin 114 and spacers 118 exposed. Next, in FIGS. 12A–12B, an etching (or other similar) process is used to remove spacers 118 using well-known techniques. Note that because of the protective mask 122, the height of the spacer 120 is not affected by this etching process. In FIGS. 13A–13B, the protective mask 122 is removed and an impurity is implanted into the fins 112, 114 using well-known techniques. The spacers 120 can have a material composition and size characteristics sufficient to prevent transmission of the impurity through the spacers. Also, the spacers 120 can contain doping impurities that diffuse into the adjacent portions of the fin 112. These doping impurities maintain the portion of the fin (the lower portion) that is protected by the spacers 120 as a poor conductor. In this process, those fins that have larger spacers will receive a relatively smaller area of semiconductor doping 113 and those fins that do not have spacers will receive a relatively larger area of semiconductor doping 115.

As is understood by those ordinarily skilled in the art, the impurity changes the material of the fins 112, 114 from an intrinsic silicon into a semiconductor device 113, 115. Thus, the presence or absence of the spacer 120 controls how much of the fin 112 will become a semiconductor. The remainder of the fin (the portion protected by the spacer 120) will act as an insulator, while the exposed portion 113 of the fin 112 will become an active semiconductor. In this way, the absence or presence, and size of the spacer 120 controls the effective semiconductor width of the fin.

Figure 14A:
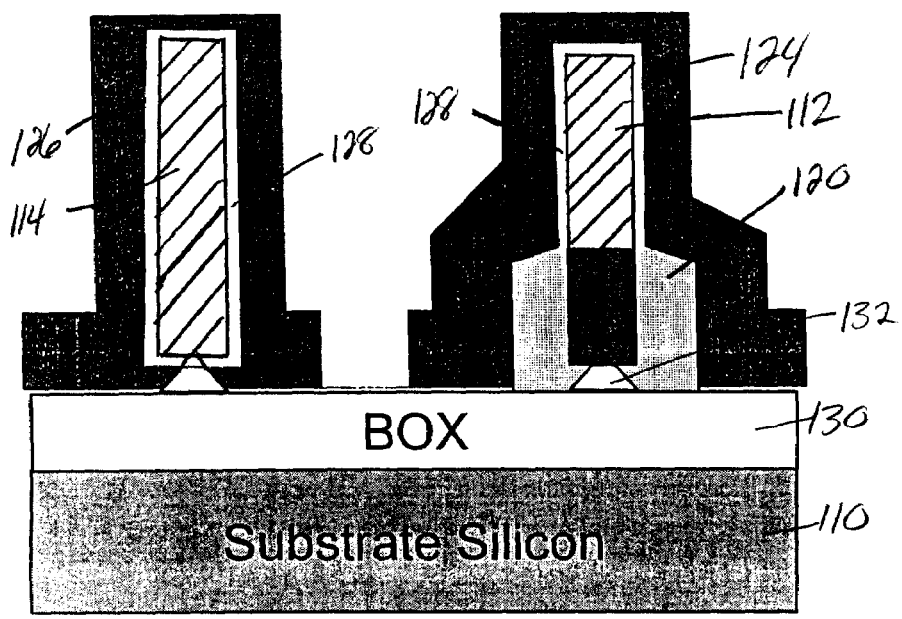
FIGS. 14A and 14B are schematic side view and top view diagrams of a partially completed FinFET structure.
Figure 14B:
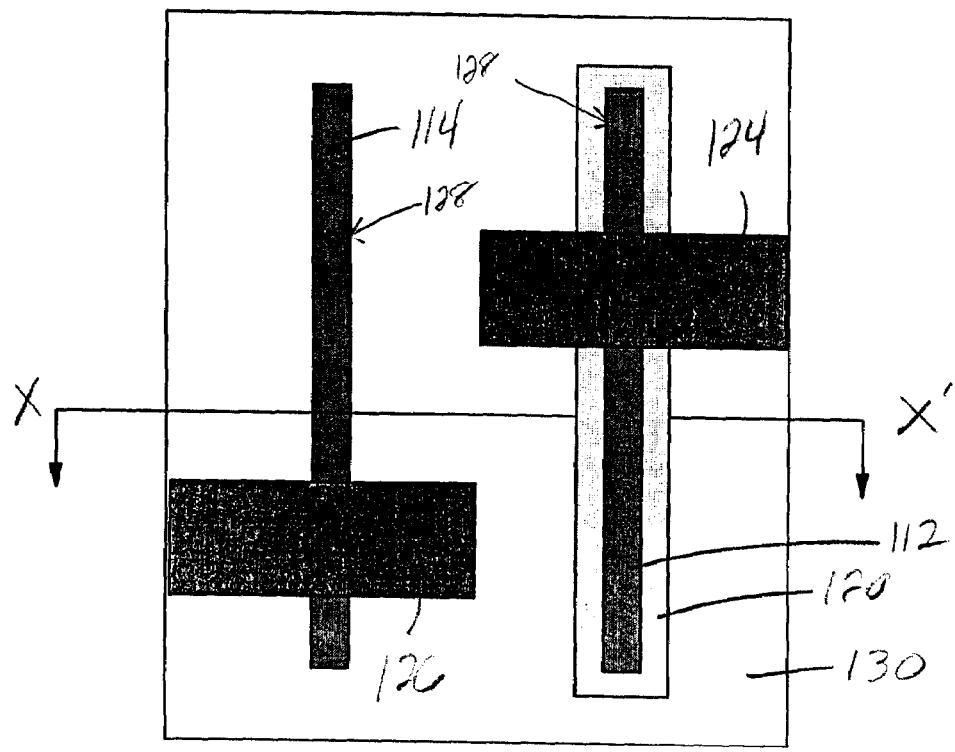

Next, as shown in FIGS. 14A and 14B, gate conductors 124, 126 are formed over the fins using well-known techniques. In this example, the gate conductors 124, 126 are separate and, therefore, the fins 112, 114 form individual transistors. However, one ordinarily skilled in the art would understand that the invention is equally applicable to transistors that utilize multiple fins per transistor where a common gate conductor covers a number of fins. Additional structures that would be formed using well-known techniques include additional sidewall insulators, source/drain regions, contacts, etc.

Figure 15:
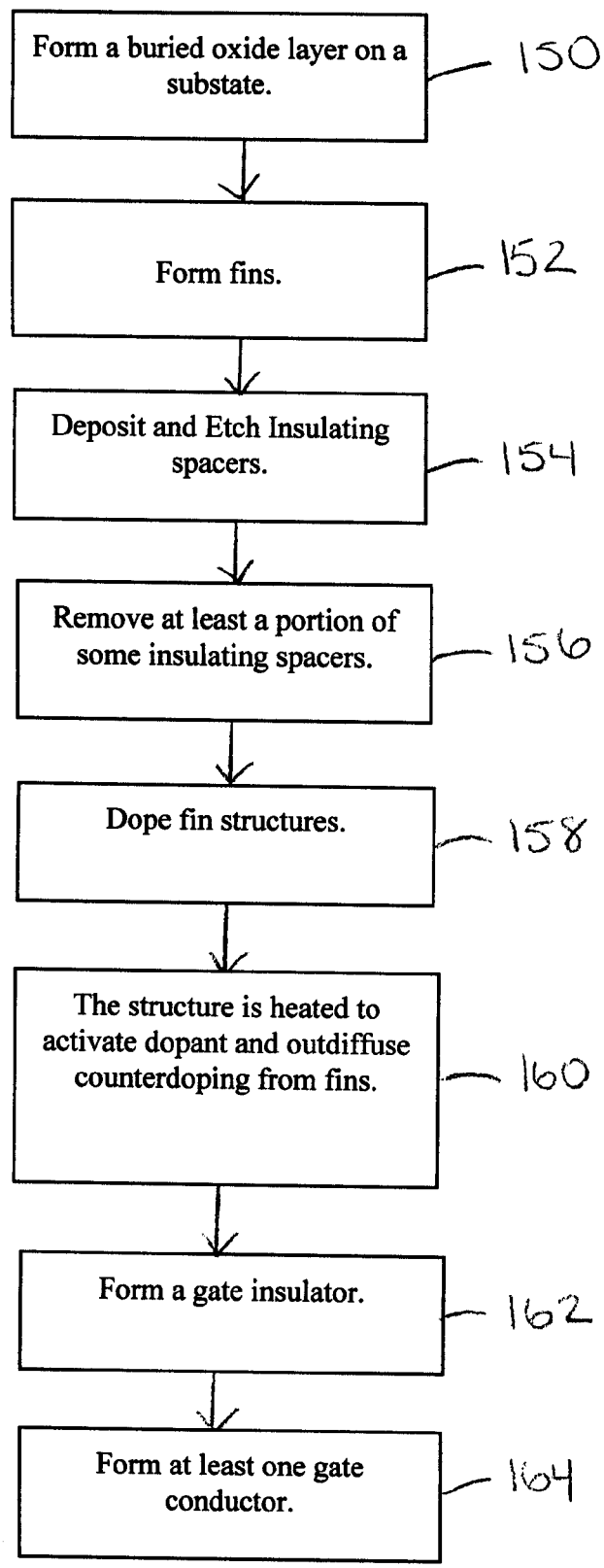
FIG. 15 is a flow diagram illustrating a preferred method of the invention.
Figure 1A:
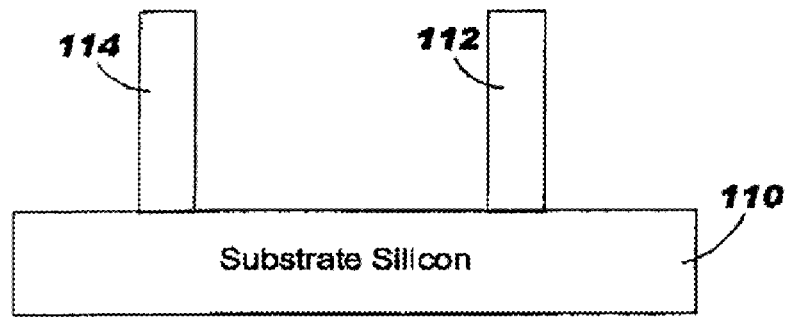
Figure 1B:
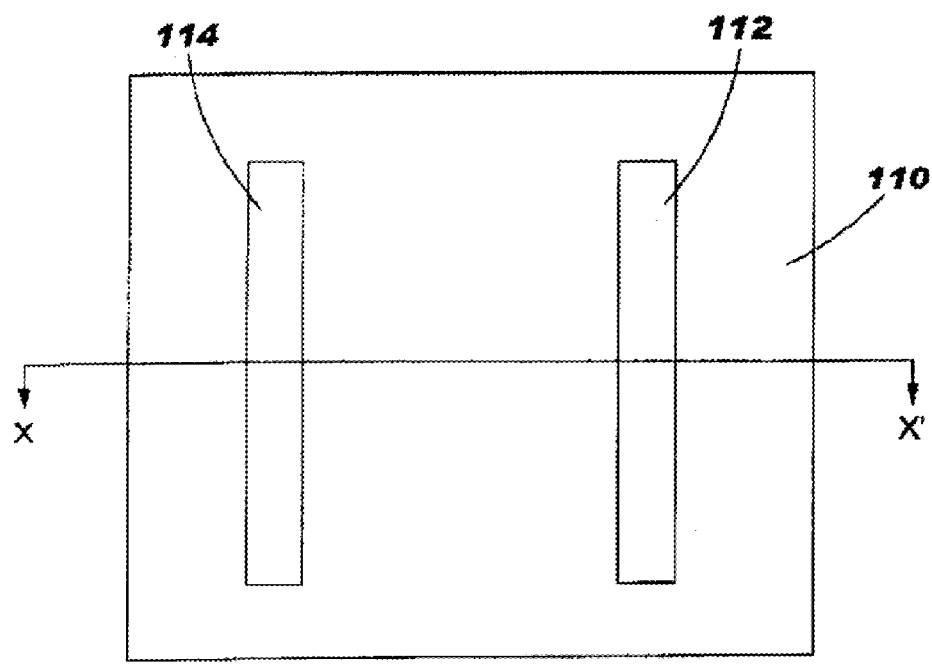
Figure 2A:
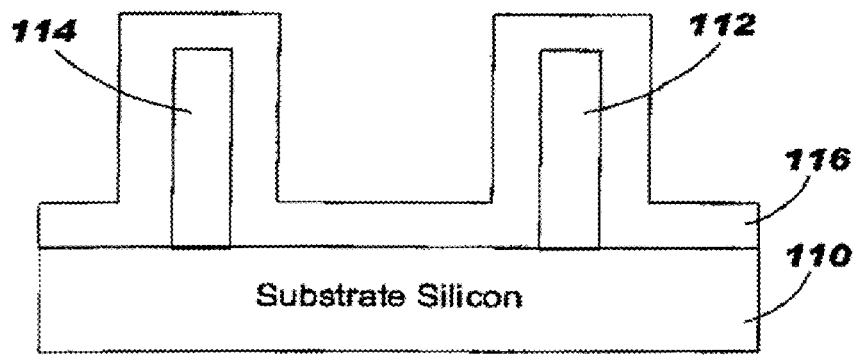
Figure 2B:
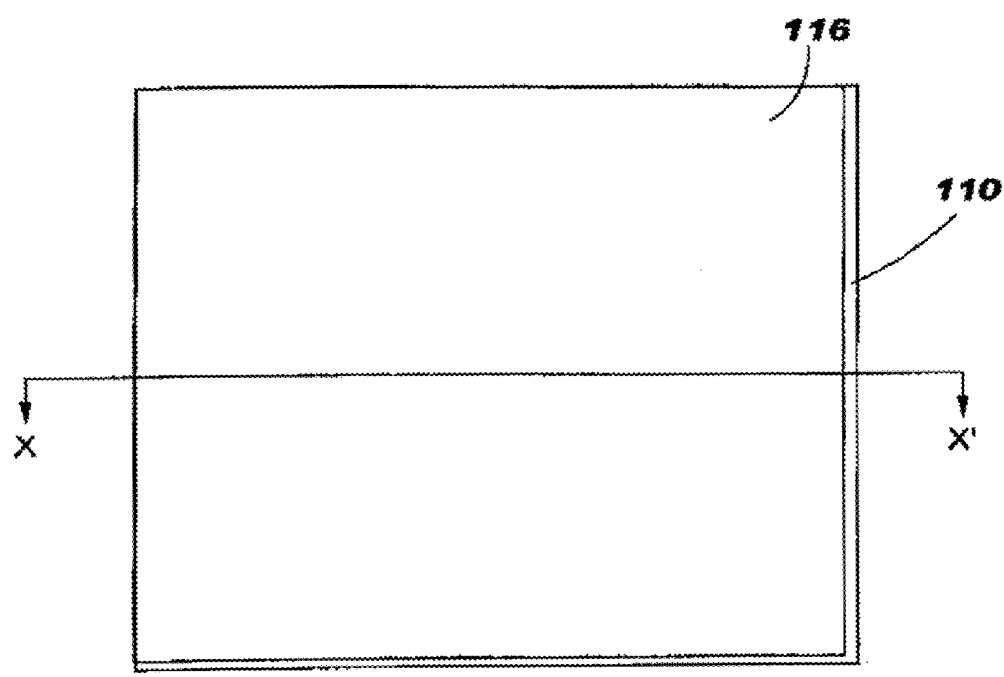
Figure 3A:
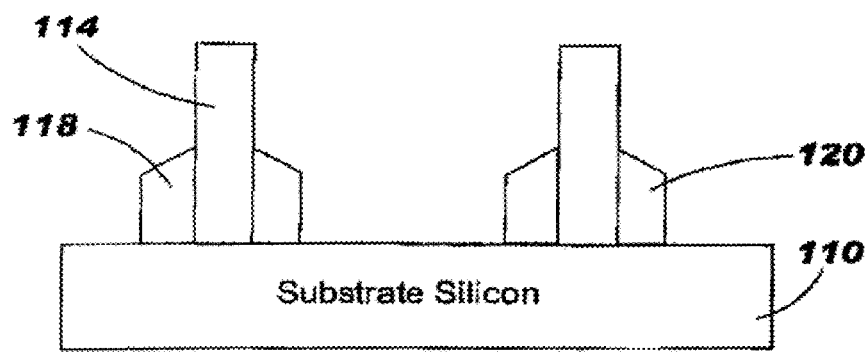
Figure 3B:
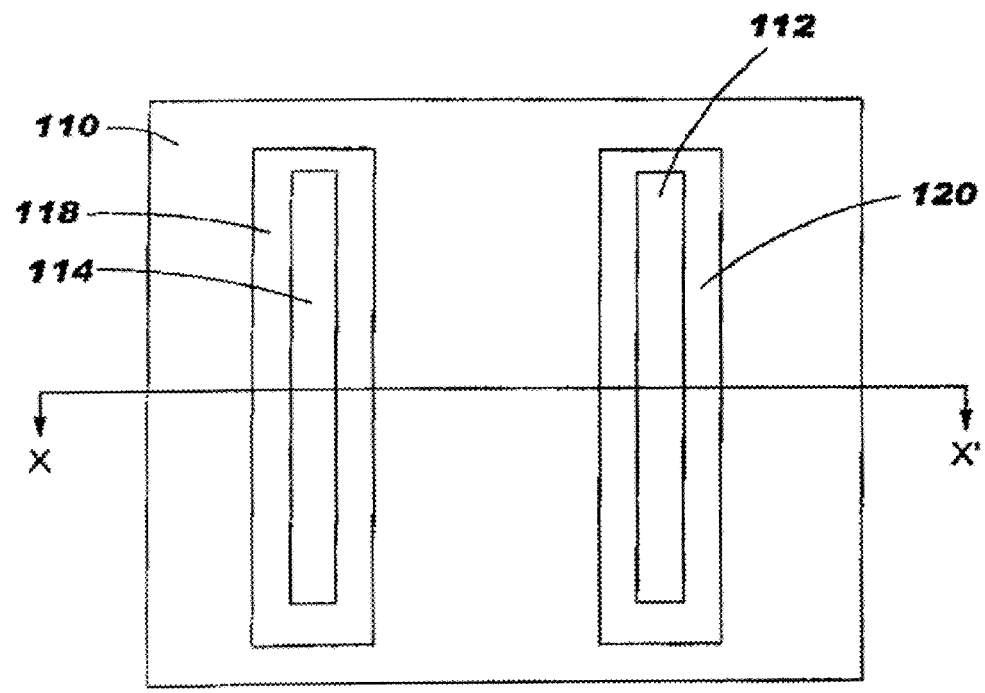
Figure 4A:
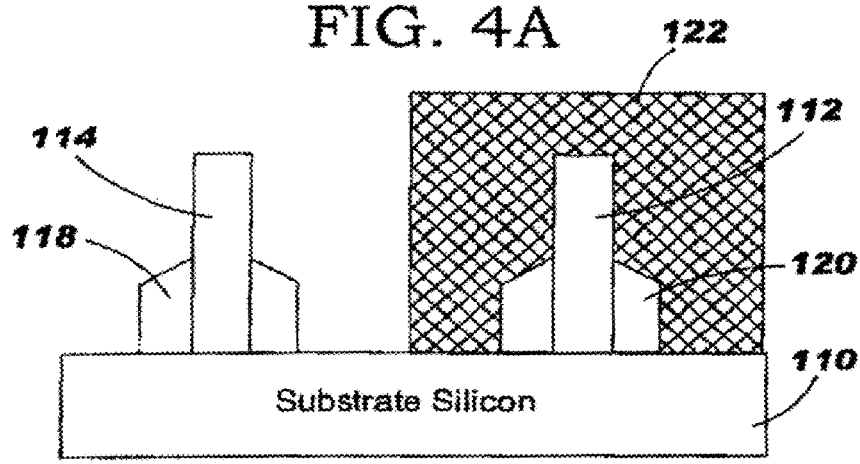
Figure 4B:
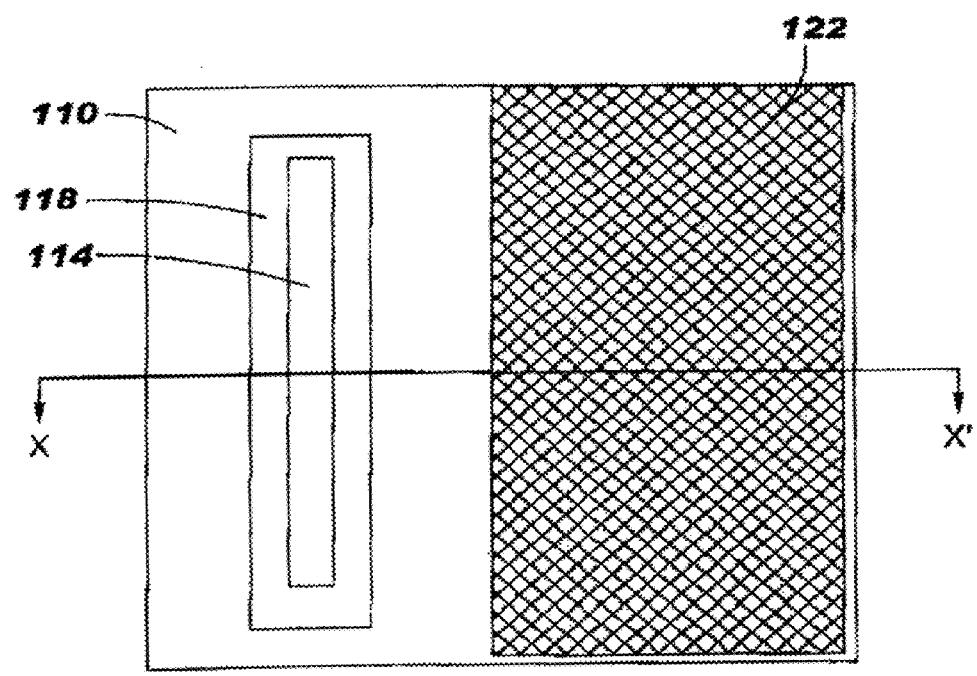
Figure 5A:
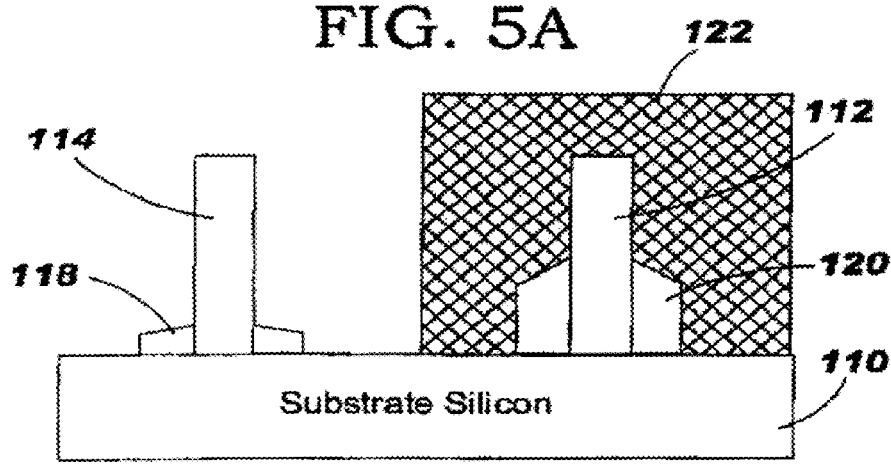
Figure 5B:
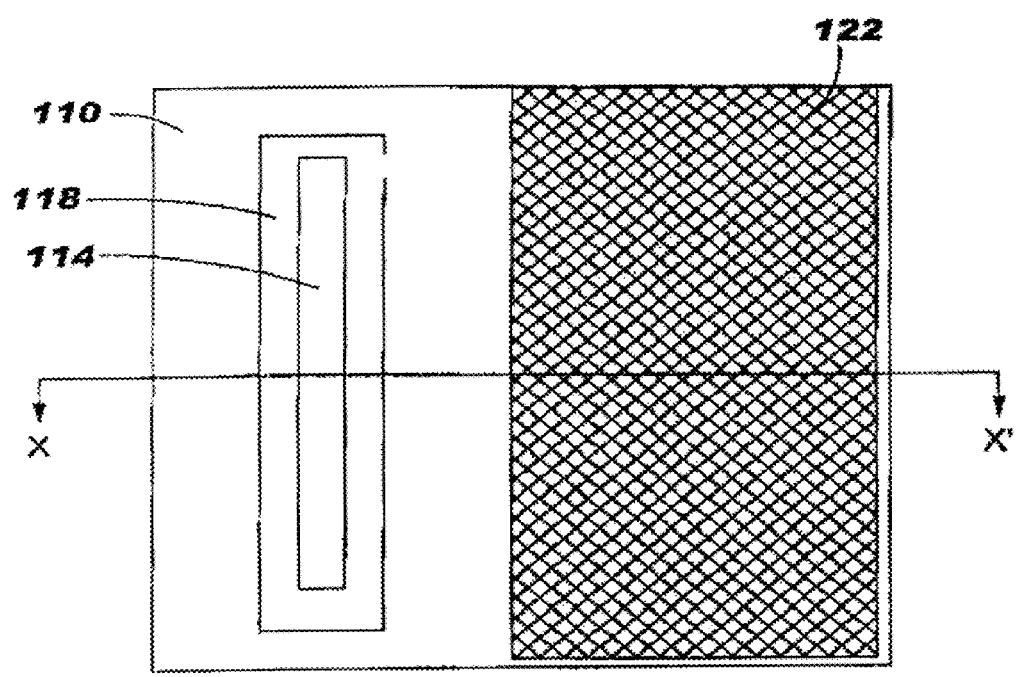
Figure 6A:
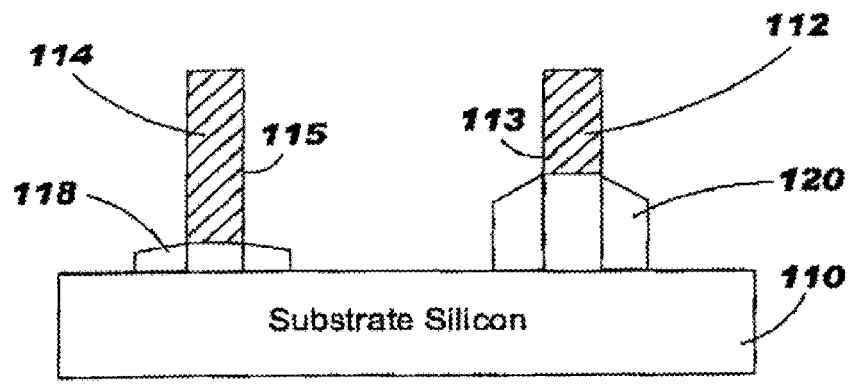
Figure 6B:
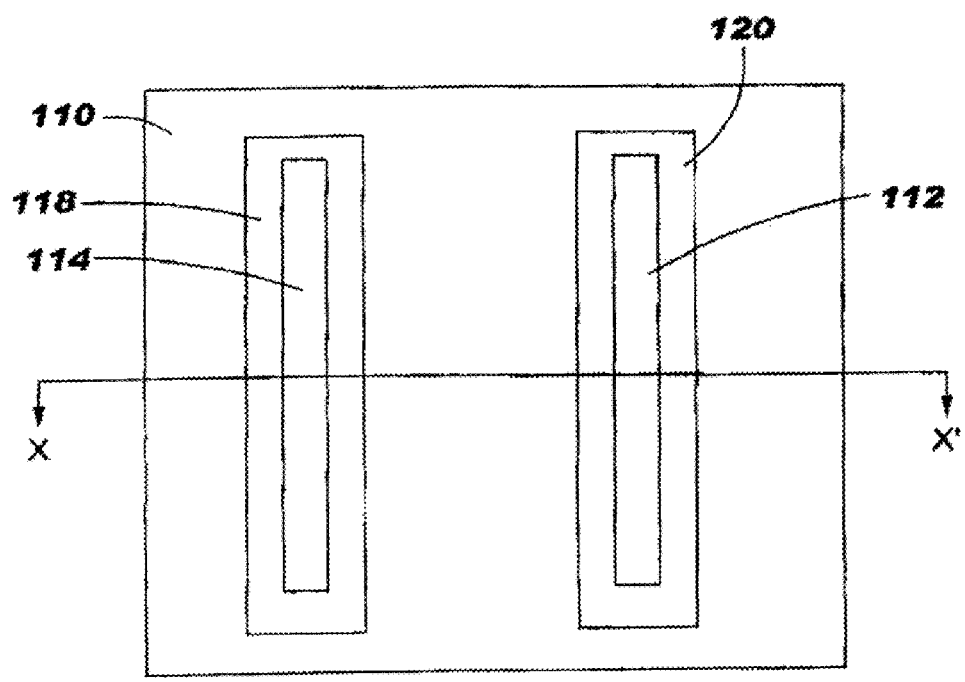
Figure 7A:
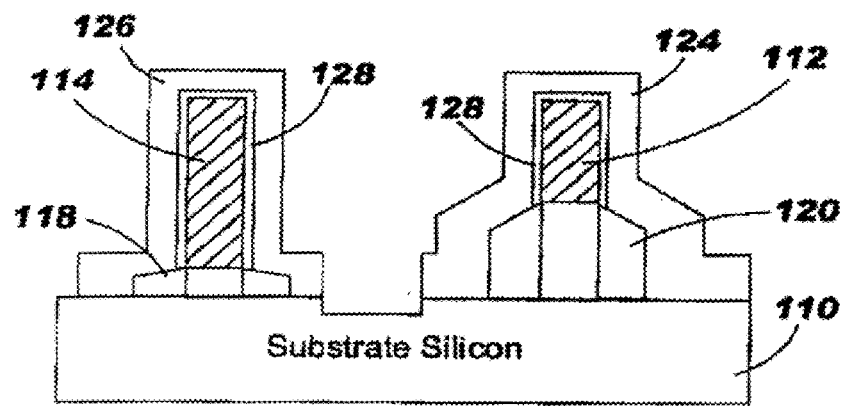
Figure 7B:
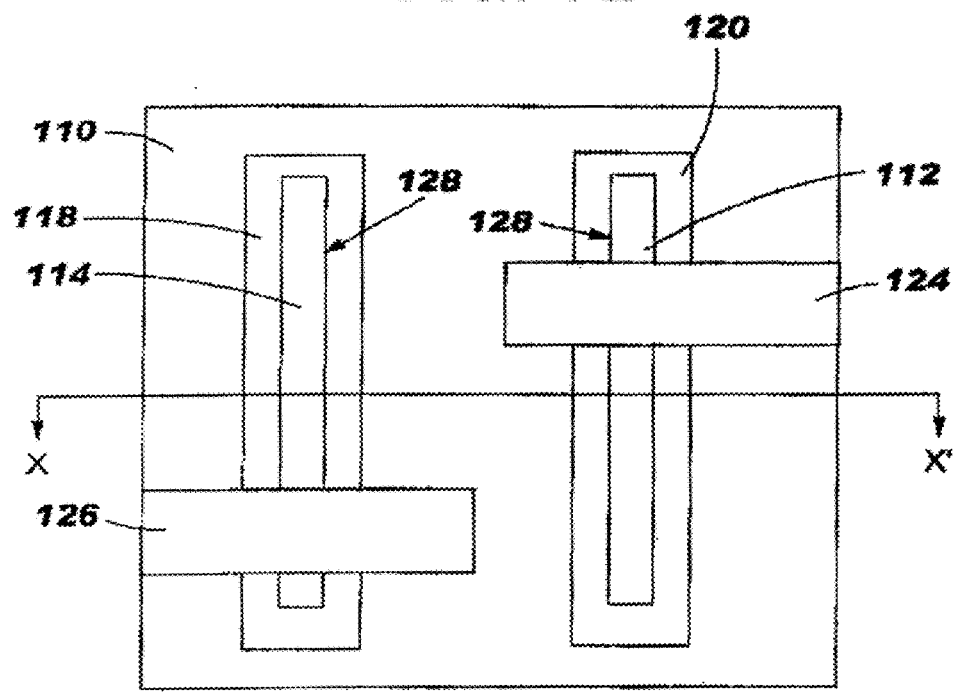
Figure 8A:
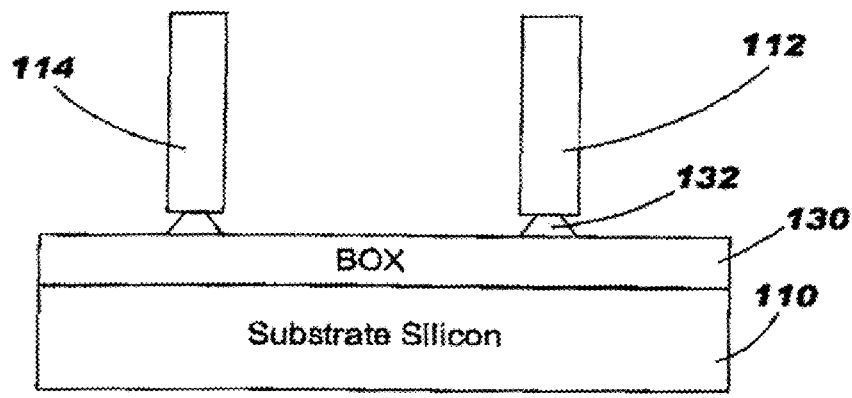
Figure 8B:
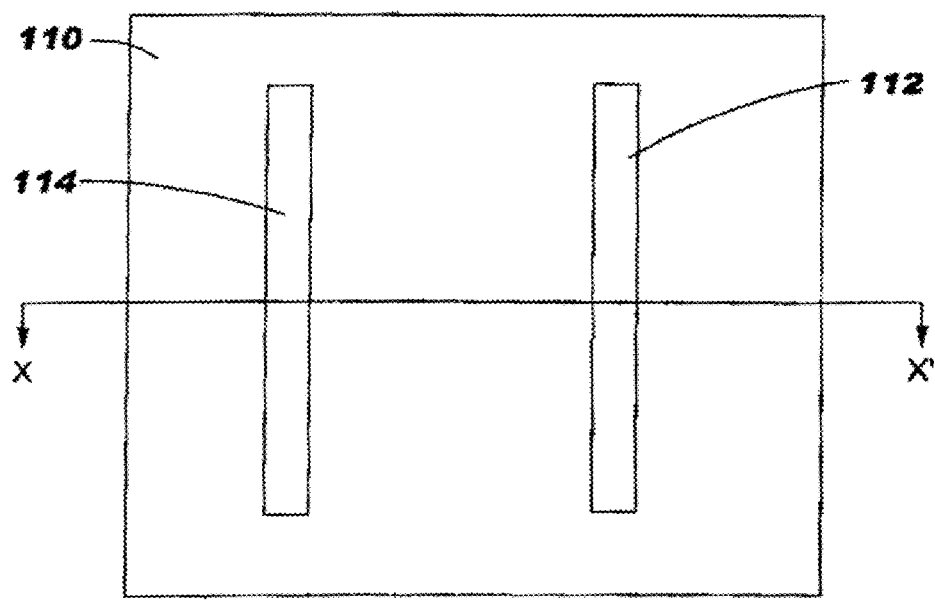
Figure 9A:
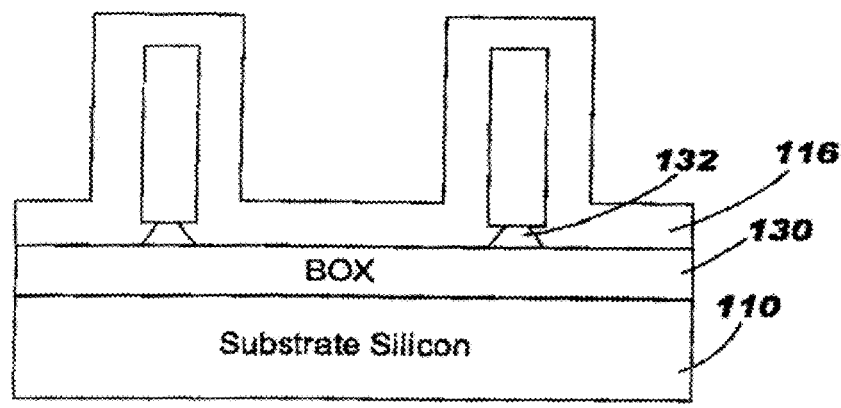
Figure 9B:
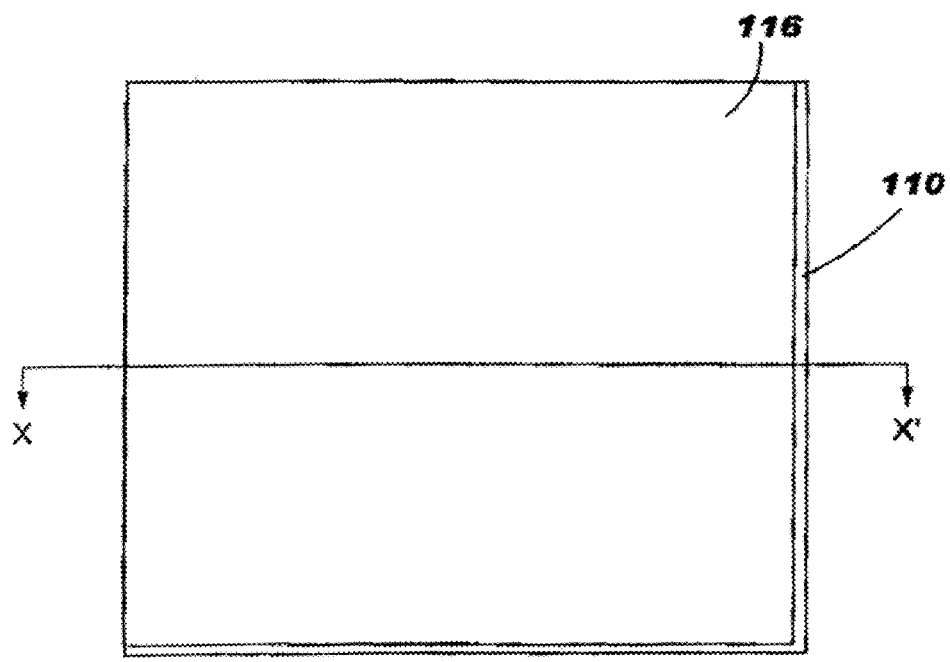
Figure 10A:
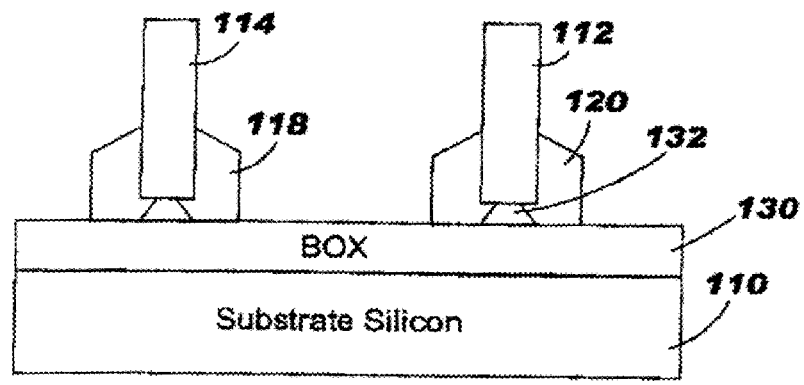
Figure 10B:
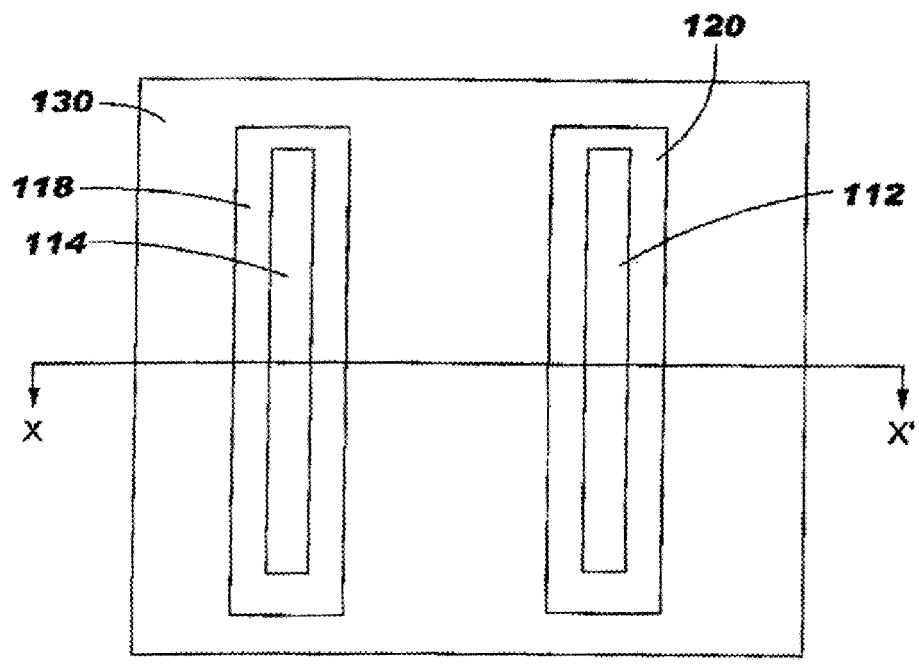
Figure 11A:
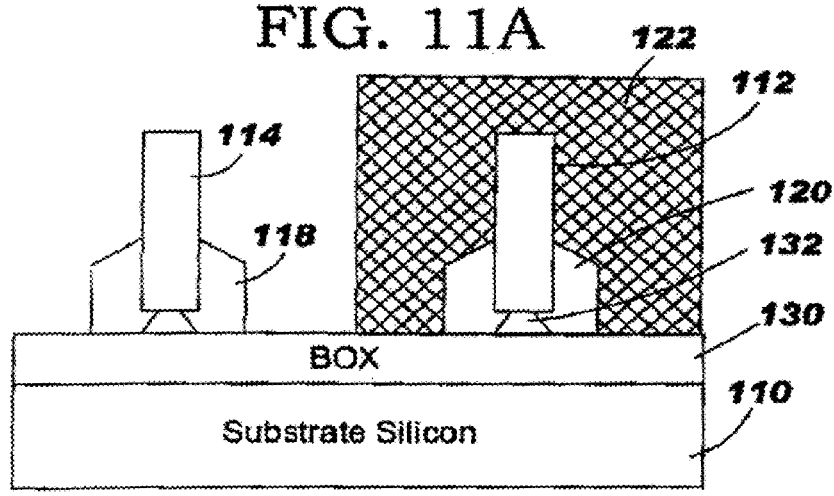
Figure 11B:
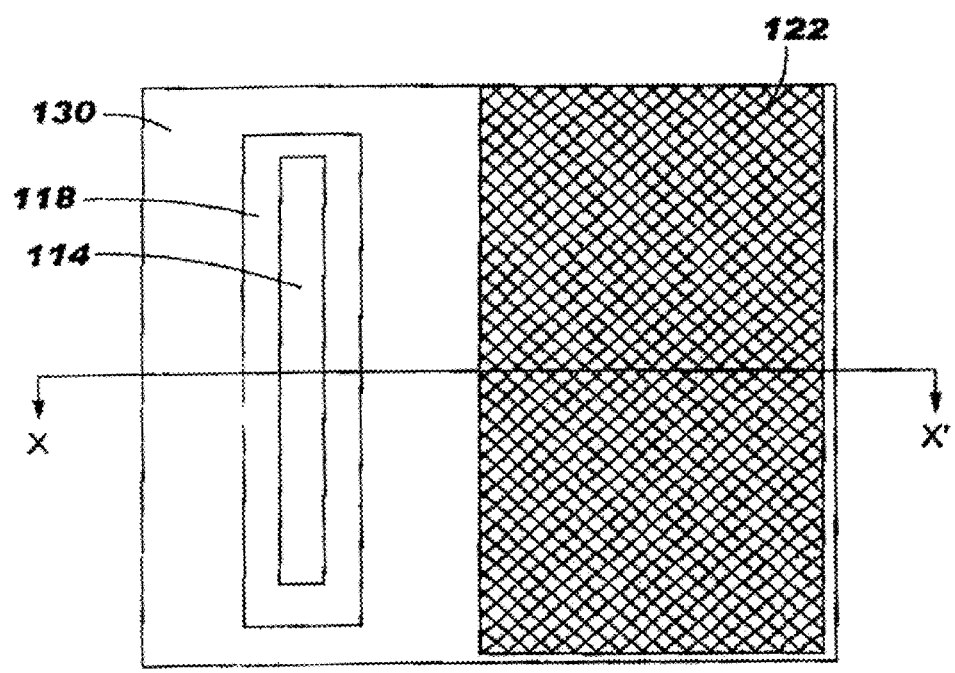
Figure 12A:
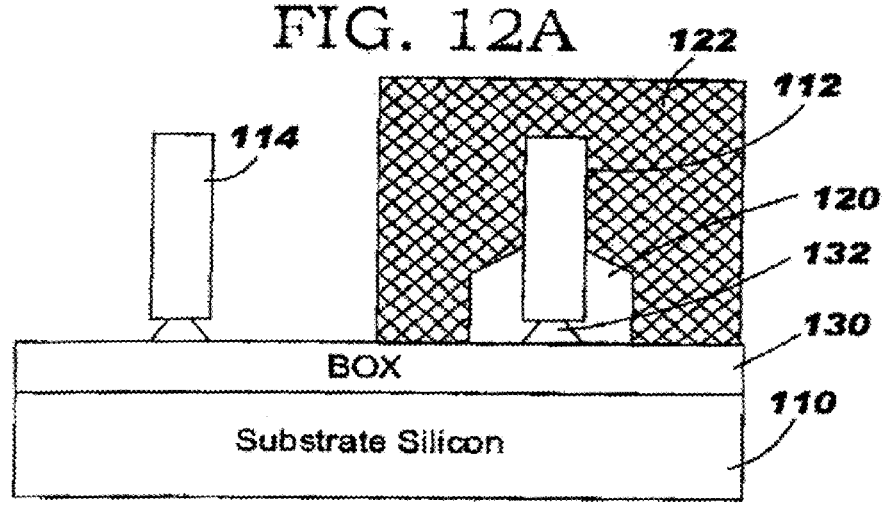
Figure 12B:
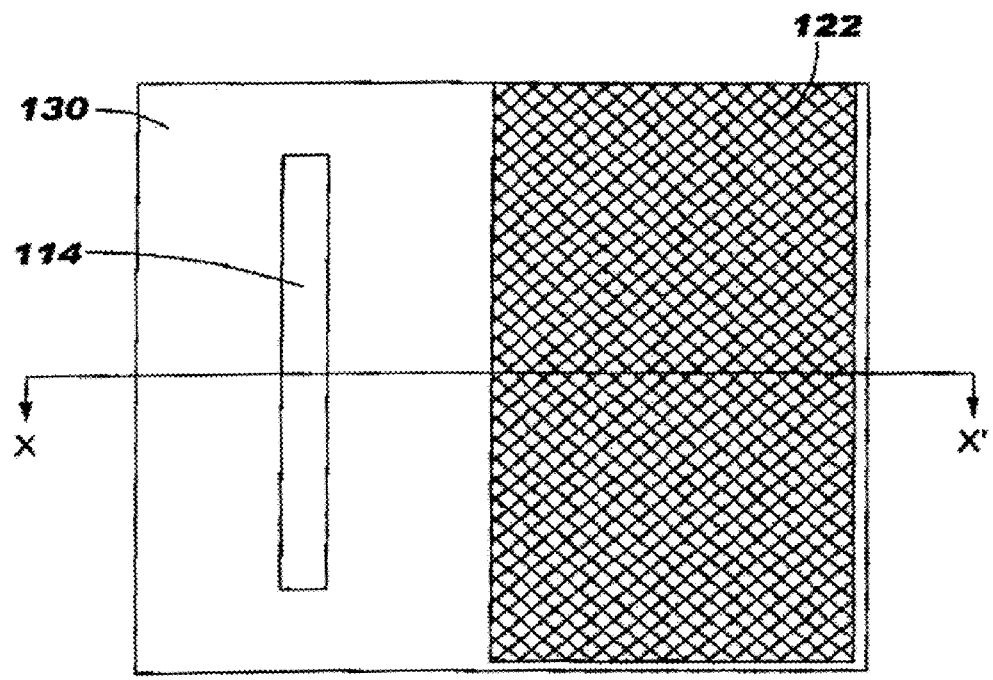
Figure 13A:
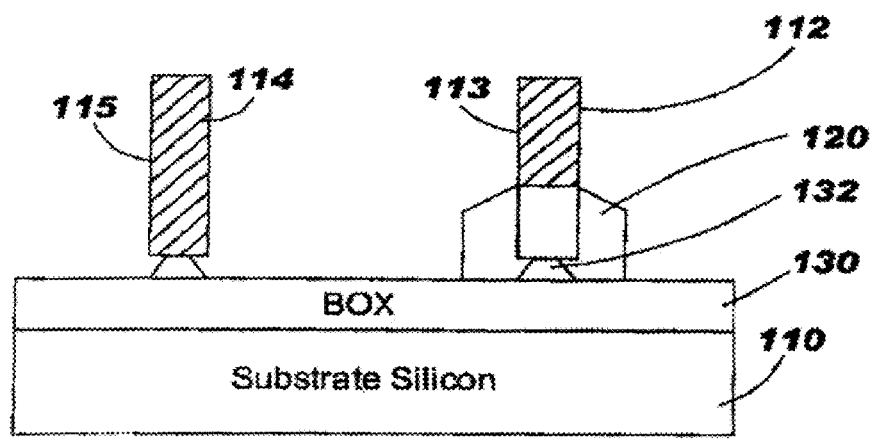
Figure 13B:
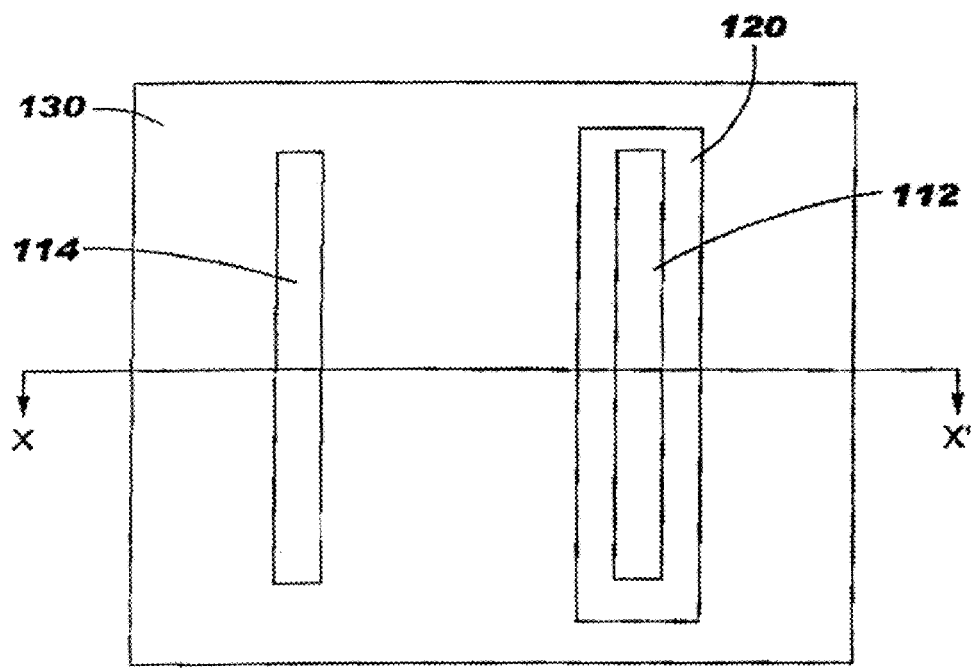
Figure 14A:
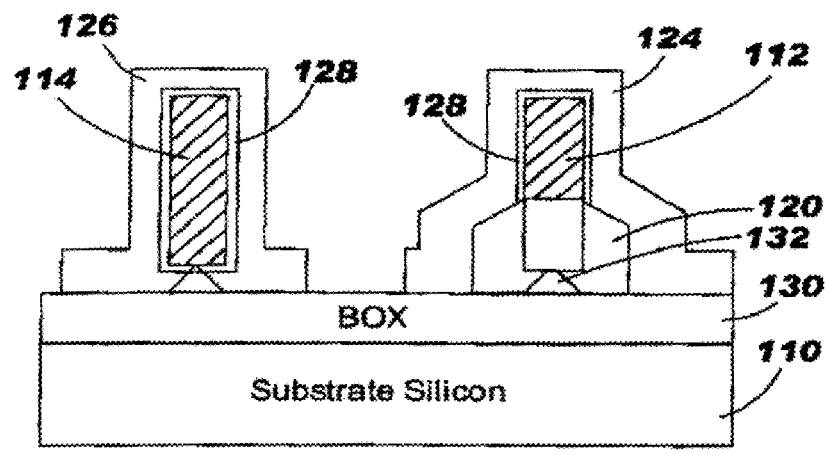
Figure 14B:
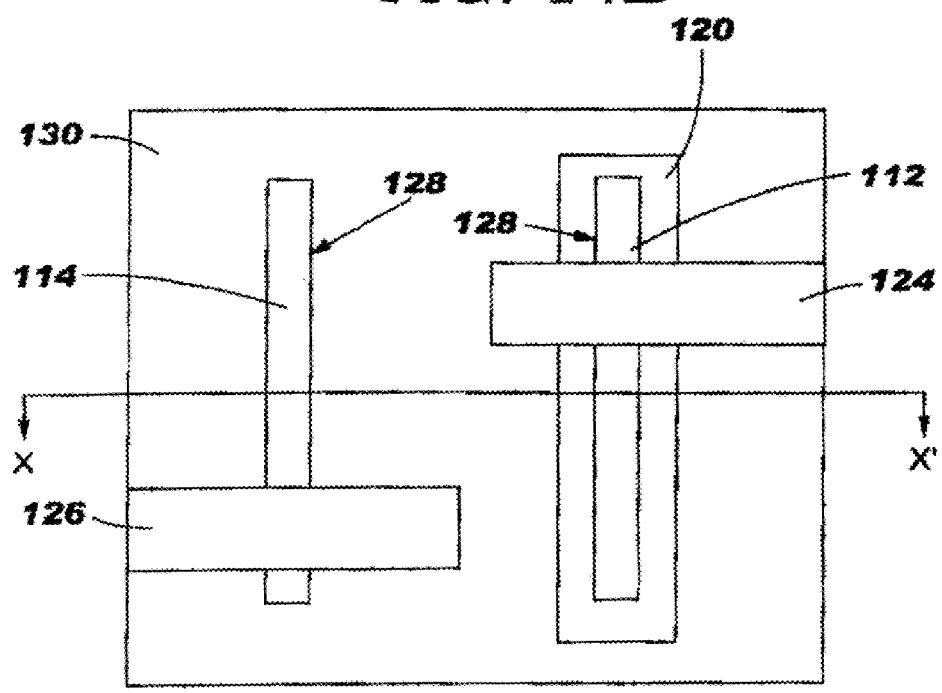
Figure 15:
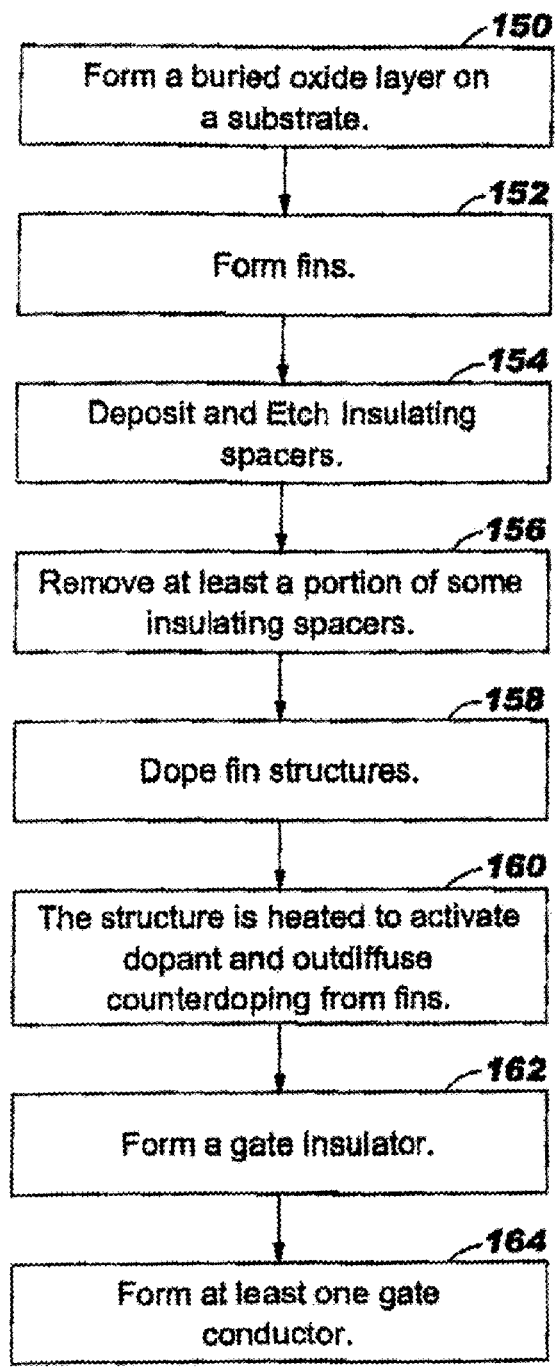

This processing flow is shown in flowchart form in FIG. 15. More specifically, the invention begins by forming a buried oxide layer on a substrate 150 (or simply starts with a silicon substrate). Next, the invention forms fins 152 and insulating spacers 154 adjacent the fins. The fin structures can all have the same size. The invention removes at least a portion of (or completely removes) some of the insulating spacers 156, such that first insulating spacers cover a larger portion of first fin structures when compared to the portion of second fin structures covered by second insulating spacers.

After removing the portions or all of some of the insulating spacers, the invention dopes the portions of the fin structures that are not protected by the insulating spacers 158 to make those portions of the fins semiconductors. In this process, those fins that have larger spacers will receive a smaller area of doping and those fins that have smaller spacers (or no spacers) will receive a larger area of doping. Therefore, there is a difference in doping between the first fins and the second fins that is caused by the differently sized spacers. The difference in doping between the first fins and the second fins changes an effective width of the second fins when compared to the first fins.

This process produces a fin-type field effect transistor (FinFET) that has a buried oxide layer over a substrate, at least one first fin structure and at least one second fin structure positioned on the buried oxide layer. First insulating spacers are adjacent the first fin structures and second insulating spacers are adjacent the second fin structures. The first insulating spacers cover a larger portion of the first fin structure when compared to the portion of the second fin structure covered by the second insulating spacers. This creates FinFETs that are not the full height of the fin.

Those fins that have larger spacers will receive a smaller area of doping and those fins that have smaller spacers will receive a larger area of doping. Therefore, there is a difference in doping between the first fins and the second fins that is caused by the differently sized spacers. The difference in doping between the first fins and the second fins changes an effective width of the second fins when compared to the first fins without having to use fins of different physical widths or use multiple fins within each transistor, as is required conventionally.

While the invention has been described in terms of preferred embodiments, those skilled in the art will recognize that the invention can be practiced with modification within the spirit and scope of the appended claims.

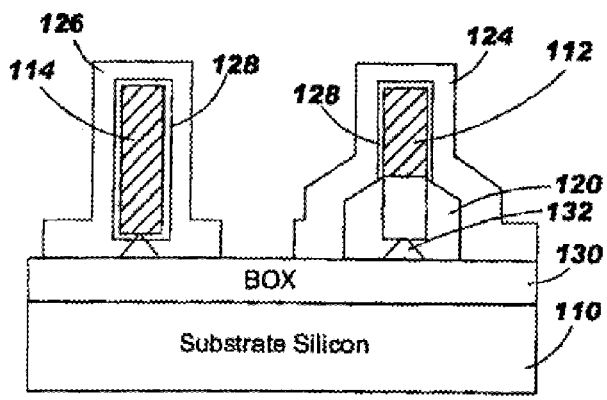

The invention claimed is:

1. A fin-type field effect transistor (FinFET) comprising:
a first fin structure positioned on a substrate;
a second fin structure positioned on said substrate;
first spacers adjacent said first fin structure; and
second spacers adjacent said second fin structure,
wherein said first spacers cover a larger portion of said first fin structure when compared to the portion of said second fin structure covered by said second spacers, and
wherein first spacers are larger than said second spacers and the difference in size between said first spacers and said second spacers is adapted to provide a difference between said first fin structure and said second fin structure.

2. The FinFET in claim 1, wherein the difference in size between said first spacers and said second spacers is adapted to provide a difference in doping between said first fin structure and said second fin structure.

3. The FinFET in claim 2, wherein said difference in doping between said first fin structure and said second fin structure changes an effective channel width of said first fin structure when compared to said second fin structure.

4. The FinFET in claim 1, wherein said first spacers and said second spacers include doping impurities adapted to diffuse into adjacent portions of said first fin structure and said second fin structure so as to cause the portion of each fin structure that is adjacent each spacer to comprise an electrically inactive portion of the device.

5. The FinFET in claim 1, wherein said first spacers and said second spacers comprise the same material.

6. The FinFET in claim 1, wherein said first spacers and said second spacers comprise the same material.

7. A fin-type field effect transistor (FinFET) comprising:
a first fin structure positioned on a substrate;
a second fin structure positioned on said substrate;
first spacers adjacent said first fin structure; and
second spacers adjacent said second fin structure, wherein said first spacers cover a larger portion of said first fin structure when compared to the portion of said second fin structure covered by said second spacers, and wherein said first fin structure is the same physical size as said second fin structure.

8. A fin-type field effect transistor (FinFET) comprising:
a first fin structure positioned on a substrate;
a second fin structure positioned on said substrate;
first spacers adjacent said first fin structure; and
second spacers adjacent said second fin structure,
wherein said first spacers cover a larger portion of said first fin structure when compared to the portion of said second fin structure covered by said second spacers, further comprising:
   at least one gate conductor over said first fin structure and said second fin structure; and
   a gate insulator positioned between said gate conductor and said first fin structure and said second fin structure.

9. A fin-type field effect transistor (FinFET) comprising:
a buried oxide layer over a substrate;
a first fin structure positioned on said buried oxide layer;
a second fin structure positioned OD said buried oxide layer;
spacers adjacent only said first fin structure; and
a gate insulator covering a full length of said second fin structure,
wherein said spacers are adapted to provide a difference in doping between the first fin structure and the second fin structure.

10. The FinFET in claim 9, wherein said difference in doping between said first fin structure and said, second fin structure changes an effective channel width of said first fin structure when compared to said second fin structure.

11. A fin-type field effect transistor (FinFET) comprising:
a buried oxide layer over a substrate;
a first fin structure positioned on said buried oxide layer;
a second fin structure positioned on said buried oxide layer;
spacers adjacent only said first fin structure; and
a gate insulator covering a full length of said second fin structure,
wherein said spacers include doping impurities adapted to diffuse into adjacent portions of said first fin structure so as to cause the portion of said first fin structure that is adjacent said first spacers to comprise an electrically inactive portion of the device.

* * * * *

UNITED STATES PATENT AND TRADEMARK OFFICE
CERTIFICATE OF CORRECTION

| | | |
|---|---|---|
| PATENT NO. | : 7,224,029 B2 | |
| APPLICATION NO. | : 10/707964 | |
| DATED | : May 29, 2007 | |
| INVENTOR(S) | : Anderson et al. | |

It is certified that error appears in the above-identified patent and that said Letters Patent is hereby corrected as shown below:

The title page showing the illustrative figure should be deleted to be replaced with the attached title page.

The drawing sheets, consisting of Figs. 1A-15, should be deleted to be replaced with the drawing sheets, consisting of Figs. 1A-15, as shown on the attached page.

Signed and Sealed this

Seventeenth Day of February, 2009

JOHN DOLL
*Acting Director of the United States Patent and Trademark Office*

(12) United States Patent
Anderson et al.

(10) Patent No.: US 7,224,029 B2
(45) Date of Patent: May 29, 2007

(54) METHOD AND STRUCTURE TO CREATE MULTIPLE DEVICE WIDTHS IN FINFET TECHNOLOGY IN BOTH BULK AND SOI

(75) Inventors: Brent A. Anderson, Jericho, VT (US); Edward J. Nowak, Essex Junction, VT (US); Jed H. Rankin, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 66 days.

(21) Appl. No.: 10/707,964

(22) Filed: Jan. 28, 2004

(65) Prior Publication Data
US 2005/0161739 A1    Jul. 28, 2005

(51) Int. Cl.
*H01L 21/36* (2006.01)
*H01L 27/01* (2006.01)

(52) U.S. Cl. ............ 257/347; 257/350; 257/351; 257/369; 257/344; 257/296

(58) Field of Classification Search ............ 257/200, 257/201, 202, 207, 205, 349, 350, 351, 374, 257/208, 369, 370, 371, 376
See application file for complete search history.

(56) References Cited
U.S. PATENT DOCUMENTS

| | | | |
|---|---|---|---|
| 5,739,057 A | 4/1998 | Tiwari et al. | |
| 6,342,410 B1 | 1/2002 | Yu | |
| 6,432,829 B2 | 8/2002 | Muller | |
| 6,475,890 B1 | 11/2002 | Yu | |
| 6,492,212 B1 | 12/2002 | Ieong et al. | |
| 6,525,403 B2 | 2/2003 | Inaba et al. | |
| 6,562,665 B1 | 5/2003 | Yu | |
| 6,756,643 B1* | 6/2004 | Achuthan et al. | 257/365 |
| 6,787,406 B1* | 9/2004 | Hill et al. | 438/164 |
| 2003/0042531 A1 | 3/2003 | Lee et al. | |
| 2003/0102518 A1 | 6/2003 | Fried et al. | |
| 2003/0113970 A1 | 6/2003 | Fried et al. | |
| 2003/0193058 A1* | 10/2003 | Fried et al. | 257/200 |

* cited by examiner

*Primary Examiner*—Evan Pert
*Assistant Examiner*—Fazli Erdem
(74) *Attorney, Agent, or Firm*—Gibb I.P. Law Firm, LLC; William D. Sabo, Esq.

(57) ABSTRACT

Disclosed is a structure and method for producing a fin-type field effect transistor (FinFET) that has a buried oxide layer over a substrate, at least one first fin structure and at least one second fin structure positioned on the buried oxide layer. First spacers are adjacent the first fin structure and second spacers are adjacent the second fin structure. The first spacers cover a larger portion of the first fin structure when compared to the portion of the second fin structure covered by the second spacers. Those fins that have larger spacers will receive a smaller area of semiconductor doping and those fins that have smaller spacers will receive a larger area of semiconductor doping. Therefore, there is a difference in doping between the first fins and the second fins that is caused by the differently sized spacers. The difference in doping between the first fins and the second fins changes an effective width of the second fins when compared to the first fins.

11 Claims, 15 Drawing Sheets